US007981327B2

(12) United States Patent
Sakaguchi et al.

(10) Patent No.: US 7,981,327 B2
(45) Date of Patent: Jul. 19, 2011

(54) METHOD FOR PRODUCING METAL PARTICLE DISPERSION, CONDUCTIVE INK USING METAL PARTICLE DISPERSION PRODUCED BY SUCH METHOD, AND CONDUCTIVE COATING FILM

(75) Inventors: Kaori Sakaguchi, Tokyo (JP); Kinya Shiraishi, Tokyo (JP)

(73) Assignee: Toyo Ink Mfg. Co. Ltd., Tokyo (JP)

( * ) Notice: Subject to any disclaimer, the term of this patent is extended or adjusted under 35 U.S.C. 154(b) by 320 days.

(21) Appl. No.: 12/083,584

(22) PCT Filed: Oct. 13, 2006

(86) PCT No.: PCT/JP2006/320493
§ 371 (c)(1),
(2), (4) Date: Apr. 14, 2008

(87) PCT Pub. No.: WO2007/043664
PCT Pub. Date: Apr. 19, 2007

(65) Prior Publication Data
US 2009/0258202 A1    Oct. 15, 2009

(30) Foreign Application Priority Data

Oct. 14, 2005 (JP) ................................. 2005-299501
Apr. 28, 2006 (JP) ................................. 2006-125749

(51) Int. Cl.
*H01B 1/02* (2006.01)
(52) U.S. Cl. .............. 252/518.1; 264/184; 264/246; 428/206; 438/311; 423/23
(58) Field of Classification Search .............. 252/500, 252/518.1; 264/184, 264, 246; 428/206; 438/311; 521/92; 523/205; 106/31.1; 427/256
See application file for complete search history.

(56) References Cited

U.S. PATENT DOCUMENTS

| | | | | |
|---|---|---|---|---|
| 3,238,183 | A * | 3/1966 | Frazer | 264/246 |
| 3,886,251 | A * | 5/1975 | Sekiguchi et al. | 264/184 |
| 4,435,525 | A * | 3/1984 | Kamens | 521/92 |
| 6,476,097 | B1 * | 11/2002 | Zhao et al. | 523/205 |
| 6,878,184 | B1 | 4/2005 | Rockenberger et al. | |
| 2005/0183543 | A1 | 8/2005 | Sasaki et al. | |
| 2006/0073667 | A1 * | 4/2006 | Li et al. | 438/311 |
| 2007/0134491 | A1 | 6/2007 | Atsuki et al. | |
| 2009/0258202 | A1 * | 10/2009 | Sakaguchi et al. | 428/206 |

FOREIGN PATENT DOCUMENTS

| | | |
|---|---|---|
| JP | 61-276907 | 12/1986 |
| JP | 11-80647 | 3/1999 |
| JP | 11-319538 | 11/1999 |
| JP | 2002-334618 | 11/2002 |
| JP | 2004-346429 | 12/2004 |
| JP | 2005-81501 | 3/2005 |
| JP | 2005-120226 | 5/2005 |
| JP | 2005-220435 | 8/2005 |
| WO | WO 03/049515 A1 * | 6/2003 |

OTHER PUBLICATIONS

European Search Report issued in European Patent Application No. 06821864.3-2122, mailed Apr. 12, 2010.
Rao, G.R., et al., "Synthesis of CuO, Cu and CuNi alloy particles by solution combustion using carbohydrazide and N-tertiarybutoxy-carbonylpiperazine fuels", Materials Letters, 2004, pp. 3523-3527, Elsevier.
Braibanti, A., et al., "Complexes of Thiocarbohydrazide with Divalent Metals: Stability Constants in Aqueous Solutions", Inorganica Chimica Acta, 1969, pp. 459-462, vol. 3.
Talawar, M.B., et al., "Studies on lead-free initiators: synthesis, characterization and performance of transition metal complexes of carbohydrazide", Journal of Hazardous Materials, 2004, pp. 57-65, A113, Elsevier.
Rane, S.B., et al., "Influence of surfactants treatment on silver powder and its thick films", Materials Letters, 2003, pp. 3896-3100, vol. 57, Elsevier Science B.V.
Nersisyan, H.H., et al., "A new and effective chemical reduction method for preparation of nanosized silver powder and colloid dispersion", Materials Research Bulletin, 2003, pp. 948-956, vol. 38.

* cited by examiner

*Primary Examiner* — Mark Kopec
*Assistant Examiner* — Khanh Tuan Nguyen
(74) *Attorney, Agent, or Firm* — McDermott Will & Emery LLP

(57) ABSTRACT

Disclosed is a method for producing a metal particle dispersion wherein a metal compound is reduced by using carbodihydrazide represented by the formula (1) below or a polybasic acid polyhydrazide represented by the formula (2) below (wherein R represents an n-valent polybasic acid residue) in a liquid medium. By reducing the metal compound in the presence of a compound having a function preventing discoloration of the metal, there can be obtained a metal particle dispersion having excellent discoloration preventing properties. Metal particles produced by such methods have a uniform particle diameter and are excellent in dispersion stability. By using a conductive resin composition or conductive ink containing a metal particle dispersion obtained by such production methods, there can be formed a conductive coating film, such as a conductive circuit or an electromagnetic layer, having good characteristics.

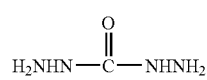

(1)

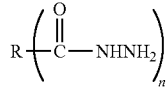

(2)

10 Claims, No Drawings

METHOD FOR PRODUCING METAL PARTICLE DISPERSION, CONDUCTIVE INK USING METAL PARTICLE DISPERSION PRODUCED BY SUCH METHOD, AND CONDUCTIVE COATING FILM

RELATED APPLICATIONS

This application is the U.S. National Phase under 35 U.S.C. §371 of International Application No. PCT/JP2006/320493, filed on Oct. 13, 2006, which in turn claims the benefit of Japanese Application Nos. 2005-299501 and 2006-125749, filed on Oct. 14, 2005, and Apr. 28, 2006, respectively, the disclosures of which Applications are incorporated by reference herein.

TECHNICAL FIELD

The present invention relates to a method for producing a fine metal particle dispersion useful as a raw material for conductive ink, a conductive ink and a conductive resin composition containing the fine metal particle dispersion produced thereby, and a conductive film formed using the conductive ink or the conductive resin composition.

BACKGROUND ART

Conventionally, conductive pastes (conductive resin compositions such as conductive ink or conductive paint and conductive adhesive) have been used widely for preparation of electrodes and conductive circuit patterns on printed wiring board substrates. Recently, the conductive pastes are used in preparation of printed wiring boards, IC tags, and circuit patterns for electromagnetic shielding. Such a conductive paste is a dispersion of conductive powder metal particles dispersed, for example, in a resin component or an organic solvent. Recently, there is increasing need for reduction in size not only of the circuit patterns on printed wiring substrates but also of the circuit patterns for IC tags or electromagnetic shielding materials. However, it is becoming increasingly difficult to cope with the demand for miniaturization of the circuit pattern with conductive pastes containing conventional metal particles having a size in the micron order, and thus, fine metal particles having a size in the nano order are attracting attention for production of accurate conductive pattern.

There are various old and new reports on a fine metal particle dispersions, and most of them are hydrosols, and the concentration of the fine metal particles therein was low. For use in applications such as conductive paste, the dispersion is advantageously organosol, and for exhibition of the properties as conductive material, the concentration of the fine metal particles is preferably higher, and thus, there exists a need for a high-yield method for producing a higher-concentration organosol.

The production methods for fine metal particles include gas-phase methods of producing particles in gas phase by vaporization and liquid-phase methods of reducing a metal compound in liquid phase by using a reducing agent such as ultrasonic wave, ultraviolet ray, or a reducing agent (see for example Patent Documents 1 and 2 below). The gas-phase methods, which are commonly carried out in pure gas, give less contaminated fine metal particles but often demand a special large-scale apparatus, and thus, the liquid-phase methods are advantageous, from the viewpoints of cost and convenience during preparative operation. Among the liquid-phase methods, methods of reducing fine metal particles by using a reducing agent are popular, and the reducing agents favorably used include hydrogen, diborane, alkali metal borohydride salts, quaternary ammonium borohydride salts, hydrazine, citric acid, alcohols, ascorbic acid, and amine compounds.

However, the reducing agents such as diborane, alkali-metal borohydride salts, quaternary ammonium borohydride salts, hydrazine, and others are very strong reagents leading to vigorous reaction with a metal compound, and thus, it is difficult to control the reaction rate, which leads to aggregation and precipitation of the fine metal particles generated, and thus it is difficult to obtain a favorable fine metal particle dispersion at good yield. In addition, many of the highly reductive reducing agents are highly basic and toxic, and thus, hazardous during operation. Reaction with citric acid, ascorbic acid, or an alcohol demands a high temperature condition such as refluxing during reduction, which generates fine metal particles at thermally elevated energy that are unstable and easily cause aggregation, and thus, it was difficult to raise the concentration of the particles. Although there are some reports on reduction by using an alcohol amine leading to relatively mild progress of reaction and subsequent extraction of the generated fine metal particles from the aqueous phase to the organic phase, it was not possible to obtain a particle dispersion containing fine metal particles with a smaller particle size distribution at high yield even by these methods. Unfavorably, some of amine compounds only form an amine complex and do not initiate reductive reaction, depending on the metal species, and thus, the kinds of the metals used are limited. In other words, the amine compounds are less flexible in practical use. It was difficult to obtain an uniform high-concentration fine metal particle dispersion with any conventional reducing agent, and there exists a need for development of a reducing agent that is safe and more reductive, giving fine metal particles having a smaller particle size distribution.

In forming a circuit with a conductive paste containing conventional micron-size metal powder, it was needed to sinter it at a high temperature of 400° C. or higher after formation of the circuit, thus imposing restriction on the substrate to be used, and it was necessary to sinter the circuit formed on a low melting base material such as plastic film at a temperature of 150 to 200° C. or lower, more preferably 150° C. or lower. Generally, when the average particle diameter of the fine metal particles is several nanometers (nm) to dozens of nm, the rate of activated-energy atoms present on the particle surface increases with respect to all atoms forming the particle, and extremely increased diffusion of metal atoms onto the surface leads to drop of the sintering temperature to a temperature significantly lower than the melting point of the bulk metal.

Recently, the method for producing a conductive film by sintering fine metal particles at low temperature by utilizing such a phenomenon is attracting attention, and various methods for producing fine metal particles were proposed.

An example thereof is a method for producing fine metal particles by using a high-molecular weight pigment dispersant as protecting agent, adding a nonaqueous solvent and water thereto, reducing a metal compound with an amine, and extracting the reduced metal into the nonaqueous solvent (see for example Patent Document 3 below), but the method employed a high-molecular weight pigment dispersant having a high thermal decomposition temperature and thus, prohibited sintering at low temperature. There is also known a method for adding an amine compound such as octylamine as protecting agent and also an acidic decomposer during production by the gas-phase method and thus, to decrease the thermal decomposition temperature of the protecting agent, but, in preparing a circuit, it was needed to heat at 200° C. or higher for a long period of time and thus difficult to form the circuit of a plastic film even by the method. In addition, the method is also disadvantageous economically, because it is a gas-phase method.

There are recently also reports on methods of forming a circuit by adding a short fatty acid metal compound or an amine metal complex having a smaller number of carbon atoms as the protecting agent for fine metal particles and sintering the dispersion at low temperature (see for example Patent Document 4 below), but the fatty acid metal compound and the amine metal complex are highly reactive and easily reduced, causing problems such as progress of reductive reaction by light and heat during long-term storage, growth or aggregation of fine metal particles, and deterioration in stability of the dispersion. In addition, because the reducing agent used by the method is a very strong reducing agent such as t-butylamine borane, sodium borohydride, or hydrogen gas, the reaction rate is so fast that it is difficult to control the particle growth. Accordingly, fatty acids having 10 or less carbon atoms, in particular, generate a greater amount of aggregates, prohibiting production of a favorable dispersion.

It was recently found that a thin film having a volume resistivity in the $10^{-6}$ Ω·cm order could be obtained by using fine metal particles having a particle size in the nano order (see for example Patent Document 5 below), but unfavorably, it was necessary to sinter the film at a high temperature of 200° C. or more to make it sufficiently conductive and achieve a desired resistivity. Silver is unfavorably sensitive to and easily sulfidized by sulfur atoms present in air such as $SO_2$ gas, and exposure of the circuit pattern face to ambient air results in generation of sulfide film and associated discoloration and deterioration in conductivity, or deterioration in communicative properties when used as an antenna circuit, and thus, there existed a need for a method for preventing metal sulfidization.

Patent Document 1: Japanese Patent Application Laid-Open (JP-A) No. 11-80647
Patent Document 2: JP-A No. 61-276907
Patent Document 3: JP-A No. 2002-334618
Patent Document 4: JP-A No. 2005-81501
Patent Document 5: JP-A No. 2005-120226

DISCLOSURE OF INVENTION

Problems to be Solved by the Invention

An object of the present invention is to provide a method for producing a fine metal particle dispersion that solves the conventional problems above, a conductive resin composition and a conductive ink prepared by using the fine metal particle dispersion, and a conductive film formed with the conductive resin composition or the conductive ink.

Specifically, the object of the present invention is to provide a method for producing a fine metal particle dispersion containing particles having a uniform particle diameter that is superior in dispersion stability, applicable to conductive pattern formation, and able to give favorable physical properties.

Another object of the present invention is to provide a conductive resin composition and conductive ink superior in patterning efficiency and a conductive film prepared by using the conductive resin composition or the conductive ink.

Yet another object of the present invention is to provide a method for producing a fine metal particle dispersion that is resistant to discoloration by sulfidization or oxidation and that gives favorable physical properties even when used for a conductive ink and so on.

Yet another object of the present invention is to provide a film superior in stability and resistant to deterioration in physical properties by discoloration.

Means for Solving the Problems

After intensive studies, the inventors have found that it was possible to solve the problems above by using a particular compound, which was not used traditionally as a reducing agent, as metal compound-reducing agent, and achieved the present invention.

Accordingly, the present invention is related to the methods of producing a fine metal particle dispersion described in the following items (1) to (14), the fine metal particle dispersion described in the following item (15), the conductive resin composition described in the following item (16), a conductive ink described in the following item (17), and a conductive film described in the following item (18).

(1) A method for producing a fine metal particle dispersion, characterized by reducing a metal compound in a liquid medium by using carbodihydrazide represented by the following Formula (1) or a polybasic acid polyhydrazide represented by the following Formula (2):

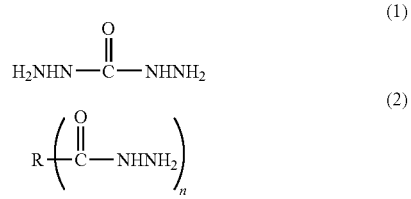

wherein R represents a n-valent polybasic acid residue.

(2) The method for producing a fine metal particle dispersion described in item (1) above, wherein the polybasic acid polyhydrazide is a dibasic acid dihydrazide.

(3) The method for producing a fine metal particle dispersion described in item (1) or (2) above, wherein the metal compound is reduced using carbodihydrazide represented by Formula (1) above or the polybasic acid polyhydrazide represented by Formula (2) after it is dispersed in the liquid medium.

(4) The method for producing a fine metal particle dispersion described in any one of items (1) to (3) above, wherein the metal compound is a fatty acid metal salt compound.

(5) The method for producing a fine metal particle dispersion described in item (4) above, wherein the fatty acid is at least one fatty acid selected from saturated and unsaturated fatty acids having 3 to 22 carbon atoms.

(6) The method for producing a fine metal particle dispersion described in any one of item (1) to (5) above, wherein the metal constituting the metal compound is at least one metal selected from Group VIII and IB metals.

(7) The method for producing a fine metal particle dispersion described in any one of items (1) to (6) above, wherein the liquid medium is a mixture of water and a non-aqueous solvent.

(8) The method for producing a fine metal particle dispersion described in item (7) above, wherein the aqueous phase is removed after reduction.

(9) The method for producing a fine metal particle dispersion described in item (1) or (2) above, wherein the metal compound is added to a mixture of an aqueous solution of carbodihydrazide or the polybasic acid polyhydrazide and a non-polar solvent.

(10) The method for producing a fine metal particle dispersion described in item (9) above, wherein the metal compound is added as an ammonia complex.

(11) The method for producing a fine metal particle dispersion described in item (9) or (10) above, wherein the metal constituting the metal compound is at least one metal selected from Group VIII and IB metals.

(12) The method for producing a fine metal particle dispersion described in item (9) or (11) above, wherein the aqueous phase is removed after reduction.

(13) The method for producing a fine metal particle dispersion treated with a preventing metal discoloration treatment described in any one of items (1) to (12) above, wherein the metal compound is reduced in the presence of a compound effective in preventing metal discoloration.

(14) The method for producing a fine metal particle dispersion described in item (13) above, wherein the compound effective in preventing metal discoloration is a sulfur atom-containing compound.

(15) A fine metal particle dispersion prepared by the production method described in any one of items (1) to (14) above.

(16) A conductive resin composition containing the fine metal particle dispersion described in item (15) above.

(17) Conductive ink containing the fine metal particle dispersion described in item (15) above.

(18) A film prepared by coating the conductive resin composition described in item (16) above or the conductive ink described in item (17) above on a base material.

EFFECTS OF THE INVENTION

In the method for producing a fine metal particle dispersion, a metal compound according to the present invention is reduced in a liquid medium by using carbodihydrazide represented by Formula (1) above or a polybasic acid polyhydrazide represented by Formula (2) above. Since the pH of the carbodihydrazide or the polybasic acid polyhydrazide is within neutral to weakly basic, each of them is safe in handling, does not react so vigorously as hydrazine or sodium borohydride when used as a reducing agent, and yet allows rapid progress of the reductive reaction without heating at high temperature, and gives fine metal particles uniform in particle diameter, while preventing aggregation of fine metal particles after reaction.

The fine metal particle dispersion obtained by reduction of the fatty acid metal salt compound remains near the fine particles even after reduction of fatty acid, functioning as a dispersant for stabilizing the fine particles, and thus, allowing elimination of the use of a resin-type dispersant that may cause deterioration in conductive when used as a conductive resin composition or a conductive ink. In addition, fatty acids have a low thermal decomposition temperature and decompose thermally even at a temperature of 200° C. or lower, and is thus, superior in low-temperature sintering efficiency.

In addition, as the compound having discoloration-preventing function is present efficiently in the region near the fine metal particles immediately after generation of fine particles, by carrying out the reductive reaction in the presence of a compound effective in preventing metal discoloration, it is possible to make a fine metal particle dispersion show its discoloration-preventing function more effectively, even in an amount smaller than that when a compound having discoloration-preventing function is added during preparation of the conductive resin composition or the ink. Thus, it is possible to obtain fine metal particles previously processed efficiently for discoloration prevention and to obtain a resin composition, an ink, or a film resistant to deterioration in design, conductivity, and film properties even in ambient air.

The ink according to the present invention, which contains a fine metal particle dispersion including metal particles with a minute particle diameter and a narrow particle size distribution, is superior in fluidity and stability and gives a conductive circuit pattern having a low volume resistivity at low temperature, for example when used as a conductive ink. Thus, it became possible to produce large amounts of conductive films and patterns by a common printing or coating method such as a flexographic printing method, a rotary screen printing method, an offset gravure printing method, a gravure printing method, an ink jet printing method, a spin coating method, a spray coating method, a die coating method, a lip coating method, a knife coating method, a curtain coating method, a roll coating method, a bar coating method, or letter press. The conductive patterns having a thickness of several μm formed by such a printing or coating method satisfy sufficiently the requirements demanded, for example, for antenna circuit for non-contact media, electromagnetic shield film, or conductive thin film, and the properties and the reliability thereof are excellent.

Further, it became possible to improve the practical performance and reduce the cost of conductive film, by using the conductive resin composition or the conductive ink according to the present invention.

BEST MODE FOR CARRYING OUT THE INVENTION

Hereinafter, favorable embodiments of the present invention will be described more in detail, but the present invention is not limited by these embodiments within the technological scope of the present invention. First, the method for producing a fine metal particle according to the present invention will be described.

The fine metal particle dispersion produced by the method according to the present invention is prepared by reducing a metal compound in a liquid medium by using a carbodihydrazide represented by the following Formula (1) or a polybasic acid polyhydrazide represented by the following Formula (2):

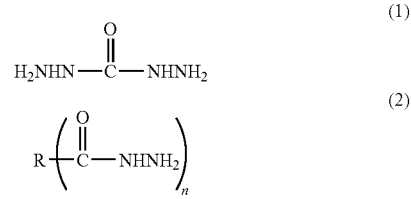

wherein R represents a n-valent polybasic acid residue.

The carbodihydrazide or the polybasic acid polyhydrazide represented by Formula (1) or (2) is a compound commonly used as a resin curing agent or a modifier; although it has not been used as a reducing agent, the inventors have found, after intensive studies, that it also functions favorably as a reducing agent for metal compounds.

As the polybasic acid polyhydrazide represented by Chemical formula (2), the reducing agent in the present invention, is not particularly limited, but, for example, a dibasic acid dihydrazide, a tribasic acid trihydrazide, or a tetrabasic acid tetrahydrazide. The dibasic acid dihydrazide is favorable among the above polybasic acid polyhydrazides, because it has high solublility in solvents, allows uniform progress of reductive reaction, and is superior in storage stability.

Examples of the dibasic acid dihydrazides include malonic dihydrazide, succinic dihydrazide, glutaric dihydrazide, adipic dihydrazide, sebacic dihydrazide, dodecanoic dihydrazide, isophthalicdihydrazide, terephthalic dihydrazide, pimelic dihydrazide, suberic dihydrazide, azelaic dihydrazide, hexadecanoic dihydrazide, 2,6-naphthoic dihydrazide, 1,4-naphthoic dihydrazide, tartaric dihydrazide, malic dihydrazide, iminodiacetic dihydrazide, and itaconic dihydrazide.

Examples of the tribasic acid trihydrazides include citric trihydrazide, trimellitic trihydrazide, nitriloacetic trihydrazide, and cyclohexanetricarboxylic trihydrazide. Examples of the tetrabasic acid tetrahydrazides include ethylenediaminetetraacetic tetrahydrazide, and pyromellitic tetrahydrazide.

The other polybasic acid polyhydrazides include polyacrylic polyhydrazides.

These polybasic acid polyhydrazides may be used alone or in combination of two or more, and may be used in combination with carbodihydrazide.

Carbodihydrazide or the polybasic acid polyhydrazide may be used as solid or as it is dissolved in solvent, but, for more uniform and efficient progress of the reaction, it is preferably used as it is dissolved in solvent. In addition, considering purification after reaction, it is preferable to use it as an aqueous solution. Considering water solubility when used in aqueous solution, adipic dihydrazide, succinic dihydrazide, and glutaric dihydrazide are preferable.

One or two or more hydrogen atoms in R (n-valent polybasic acid residue) of the polybasic acid polyhydrazide represented by Formula (2) may be substituted with functional groups such as hydroxyl group. In the present invention, the substituted derivatives are also the compounds included in carbodihydrazide and the polybasic acids polyhydrazide represented by Formula (2) above.

The amount of carbodihydrazide or the polybasic acid polyhydrazide used in the method for producing a fine metal particle dispersion according to the present invention may vary according to the kind and the concentration of the metal compound, but is commonly at least the stoichiometric amount needed for reductive precipitation of the metal from the metal compound solution. The reducing agent used in the production method according to the present invention is a polyhydrazide, which has two or more reductive functional groups, and thus, the stoichiometric ratio needed for reductive precipitation of the metal is preferably calculated on the hydrazide group basis to get the amount of the polyhydrazide to be added. If the aqueous phase is desirably removed after reduction, the excessive reducing agent is removed simultaneously, and thus, the reducing agent may be used in an amount of the stoichiometric ratio or more, and the upper limit is not particularly limited, but, considering the washing step and cost, it is preferably 6 times or less of the addition amount needed for reduction of the metal compound by hydrazide-based stoichiometric ratio.

On the other hand, the metal compound according to the present invention used in the method for producing a metal fine particle dispersion is not particularly limited, if it gives a fine metal particle dispersion by reduction, but preferably a metal salt compound. The metal salt compound is, for example, a metal salt of an inorganic or organic acid. In addition, ammonia complex compounds of the inorganic metal salt are also favorable.

The metal in the metal compound is not particularly limited, and preferably, for example, at least one compound selected from group VIII and group IB metals such as gold, silver, copper, nickel, palladium, platinum, iron, cobalt, and mercury. From the viewpoints of the physical properties and the low-temperature sintering efficiency of the resin composition such as conductive ink or conductive paint, gold, silver, and copper are favorable.

The inorganic metal salt above is not particularly limited, and examples thereof include chlorides such as chloroauric acid, chloroplatininic acid, and silver chloride; nitrate salts such as silver nitrate; acetate salts such as silver acetate and copper acetate (II); perchlorate salts such as silver perchlorate; sulfate salts such as copper sulfate (II); carbonate salts, silicate salts, and phosphate salts, and these salts are used as selected according to the desired metal.

These inorganic metal salts may be used alone or in combination of two or more.

The organic metal salt is preferably a metal salt of fatty acid. The fatty acids are carbonic acids RCOOH having a carboxyl group and a linear chain structure, and include those having the straight-chain structure and those having the branched-chain structure which is a branched alkyl group, and also saturated fatty acids and unsaturated fatty acids.

The kind of the fatty acid constituting the fatty acid metal salt compound for use in the present invention is not particularly limited, but preferably a fatty acid having an alkyl group with 3 to 22 carbon atoms, from the viewpoints of low-temperature degradability, affinity with nonaqueous solvent, and others. Such a fatty acid above is favorable, because it functions as a raw material and also as a dispersant effective in stabilizing the metal fine particles generated after reductive reaction, as it is present near the metal surface.

Examples of the fatty acids include, but are not particularly limited to, straight-chain saturated fatty acids such as propionic acid, butyric acid, valeric acid, caproic acid, enanthic acid, caprylic acid, pelargonic acid, capric acid, undecanoic acid, lauric acid, tridecanoic acid, myristic acid, pentadecanoic acid, palmitic acid, heptadecanoic acid, stearic acid, nonadecanoic acid, arachic acid, behenic acid, rignoceric acid, cerotic acid, heptacosanoic acid, montanic acid, melissic acid, and laccelic acid.

Examples of the straight-chain unsaturated fatty acids include acrylic acid, crotonic acid, isocrotonic acid, undecylenoic acid, oleic acid, elaidic acid, cetoleic acid, erucic acid, brassidic acid, sorbic acid, linolic acid, linolenic acid, arachidonic acid, propiolic acid, and stearolic acid. Considering stability and low-temperature degradability, favorable among them are caproic acid, enanthic acid, caprylic acid, myristic acid, oleic acid, stearic acid, and the like.

Examples of the branched fatty acids include 2-ethylhexanoic acid, 2-ethylisohexanoic acid, 2-propylheptanoic acid, 2-butyloctanoic acid, 2-isobutylisooctanoic acid, 2-pentylnonanoic acid, 2-isopentylnonanoic acid, 2-hexyldecanoic acid, 2-hexylisodecanoic acid, 2-butyldodecanoic acid, 2-isobutyldodecanoic acid, 2-heptylundecanoic acid, 2-isoheptylundecanoic acid, 2-isoheptylisoundecanoic acid, 2-dodecylhexanoic acid, 2-isododecylhexanoic acid, 2-octyldodecanoic acid, 2-isooctyldodecanoic acid, 2-octylisododecanoic acid, 2-nonyltridecanoic acid, 2-isononylisotridecanoic acid, 2-decyldodecanoic acid, 2-isodecyldodecanoic acid, 2-decylisododecanoic acid, 2-decyltetradecanoic acid, 2-octylhexadecanoic acid, 2-isooctylhexadecanoic acid, 2-undecylpentadecanoic acid, 2-isoundecylpentadecanoic acid, 2-dodecylheptadecanoic acid, 2-isododecylisoheptadecanoic acid, 2-decyloctadecanoic acid, 2-decylisooctadecanoic acid, 2-tridecylheptadecanoic acid, 2-isotridecylisoheptadecanoic acid, 2-tetradecyloctadecanoic acid, 2-isotetradecyloctadecanoic acid, 2-hexadecylhexadecanoic acid, 2-hexadecyltetradecanoic acid, 2-hexadecylisohexadecanoic acid, 2-isohexadecylisohexadecanoic acid, 2-pentadecylnonadecanoic acid, 2-isopentadecylisononadecanoic acid, 2-tetradecylbehenic acid, 2-isotetradecylbehenic acid, 2-tetradecylisobehenic acid, and 2-isotetradecylisobehenic acid.

Examples of the tertiary fatty acids include pivalic acid, neononanoic acid, neodecanoic acid, Ekacid 9 (manufactured by Idemitsu Petrochemical Company), and Ekacid 13 (manufactured by Idemitsu Petrochemical Company).

These fatty acids may be used alone or in combination of two or more thereof in production of the metal salt.

The fatty acid metal salt compounds can be prepared easily by a known method. For example, a fatty acid metal salt compound is prepared easily by dissolving a commercially available fatty acid sodium salt, or that obtained by dissolving and mixing a fatty acid and sodium hydroxide in water, in purified water, adding a desirable inorganic metal salt in the stoichiometric amount, collecting the precipitated fatty acid metal salt compound under precipitation, and drying the salt.

The liquid medium used in the method for producing a fine metal particle dispersion according to the present invention is not particularly limited, but preferably water or a nonaqueous solvent, from the viewpoint of productivity, for example, during removal of impurities and others. The nonaqueous solvent is not particularly limited, if is cause phase separation with water, and examples thereof include chloroform, cyclohexane, benzene, n-hexane, toluene, cyclohexanone, 1-methoxyisopropanol acetate, diethylether, methylisobutylketone, carbon tetrachloride, methylene chloride, ethyl acetate, butyl acetate, petroleum ether, and silicone oil. The nonaqueous solvent for use may be a reactive organic solvent. The reactive organic solvent is not particularly limited, and examples thereof include ethylenic unsaturated monomers such as (meth)acrylic acid, (meth)acrylate compounds, vinyl ether compounds, and polyallyl compounds. The nonaqueous solvents may be used alone or in combination of two or more thereof.

In the method for producing a fine metal particle dispersion according to the present invention, as described above, the fine metal particle dispersion is produced by reduction of a metal compound in a liquid medium by using a carbodihydrazide or a polybasic acid polyhydrazide, and carbodihydrazide or the polybasic acid polyhydrazide is brought into contact with the metal compound, for example, by a method (A) of performing reduction by mixing a liquid medium and a metal compound and then adding carbodihydrazide or a polybasic acid polyhydrazide thereto, or a method (B) of performing reduction by mixing a liquid medium and carbodihydrazide or a polybasic acid polyhydrazide and then adding a metal compound thereto. An optimal method, either (A) or (B), is chosen according to the kind of the compound used as the metal compound. The material added then is preferably liquid, but may be solid.

For example when an inorganic salt or the ammonia complex thereof is used as the metal compound, commonly, the method B is used preferably. Specifically, for example when a metal compound, favorably an aqueous solution of the metal compound, is added to a mixture of an aqueous solution of carbodihydrazide or a polybasic acid polyhydrazide and a nonaqueous solvent, the reductive reaction proceeds only when the droplet of the aqueous solution containing the reducing agent dispersed in the nonaqueous solvent is brought into contact with the metal compound. Then, the reduced metal, which is extracted rapidly into the nonaqueous solvent and is thus resistant to local reaction, gives minute fine metal particles which are uniform in particle diameter.

When an inorganic salt compound is used as the metal compound, the inorganic salt compound is preferably added as an ammonia complex. It is because the ammonia complex of inorganic salt compound reduces the reduction reaction rate, thus preventing generation of bulky particles due to rapid particle growth, and also neutralizes the acid generated during reduction of the inorganic salt compound, favorably keeping the pH of the reaction system constant. More preferably, the inorganic salt compound or the ammonia complex compound thereof is preferably added as an aqueous solution, because the reductive reaction proceeds more uniformly. In such a case, it is possible to remove the excessive reducing agent and impurities easily by removing the aqueous phase after reduction of the inorganic salt compound or the ammonia complex thereof.

The preparative method for the ammonia complex is not particularly limited, but, for example, it may be prepared easily by a known method, for example, of adding aqueous ammonia dropwise into an inorganic salt compound solution under stirring. The amount of ammonia added during preparation of the ammonia may vary according to the kind and the concentration of the inorganic salt compound and thus, is not particularly limited, if it is an amount of the stoichiometric ratio or more that is needed for stable solubilization of the complex and neutralization of the acid generated during reduction of the inorganic salt compound. For example, it is preferably 10 mole times or less as much as that of the metal in the inorganic salt compound from the viewpoints of purification after reaction and cost, although care should be given to silver ammonia complexes which give brown deposit in the absence of excessive ammonia. More preferably, it is 6 mole times or less as much as that of the metal in the inorganic salt compound.

Alternatively when a fatty acid metal salt is used as the metal compound, the method A is used favorably. The liquid medium dissolving or dispersing the fatty acid metal salt compound then is not particularly limited, but it is preferred to separate a nonaqueous solvent phase from water is preferable, considering the processing such as removal of impurities; and, after solubilization or dispersion of a fatty acid metal salt compound in a nonaqueous solvent, an aqueous solution of carbodihydrazide or a polybasic acid polyhydrazide of reducing agent is preferably added thereto, for example dropwise, into the nonaqueous solvent under stirring. By such a way of addition, the reductive reaction proceeds only when the fatty acid metal salt compound becomes in contact with the reducing agent present as aqueous droplets in the nonaqueous solvent, allowing stabilization of the reduced metal rapidly in the nonaqueous solvent and suppression of local reaction and thus, giving minute fine metal particles which are uniform in particle diameter. In addition, it is possible to perform purification easily only by leaving the aqueous phase still after reaction, because the excessive reducing agent, residual salt, and others are contained in the aqueous phase.

The fine metal particle dispersion according to the present invention is preferably prepared by reducing a metal compound in a liquid medium by using carbodihydrazide represented by Formula (1) above or the polybasic acid polyhydrazide represented by Formula (2) in the presence of a compound effective in preventing metal discoloration.

The compound effective in preventing metal discoloration according to the present invention is a compound that prevents oxidation and sulfidization caused by oxygen and sulfur in ambient air as they are adsorbed on the metal fine particle surface, and those having groups showing affinity with the metal fine particles surface in the molecule are used favorably. The group showing affinity with metal fine particle surface may vary according to the kind of the metal, but for example, it is generally, but not limited to, a polar group such as amino, quaternary ammonium, hydroxyl, cyano, carboxyl, thiol, or sulfonate. The affinity groups may be bound to the main chain of the compound or to the side chain, or to both of the side and main chains. In particular, compounds containing one or more nitrogen atoms and/or one or more sulfur atoms in the molecule are used favorably, and any one of common discoloration inhibitors may be used.

The compound containing nitrogen atoms and/or sulfur atoms in the molecule is not particularly limited, and examples thereof include imidazoles, triazole derivatives (benzotriazole, alkylaminotriazole, etc.), tetazole derivatives (tetrazole, tetrazolium salts, and tetrazolones), selenadiazole derivatives, higher alkylamines and the ethyleneoxide adducts thereof and the α- and β-dicarbonyl compound amine adducts, aliphatic thiol compounds (thioglycolic acid derivatives, mercaptopropionic acid derivatives, and mercaptanes), alicyclic or aromatic thiol compounds, sulfides, disulfides, mercaptoimidazole derivatives (mercaptoimidazole, mercaptobenzimidazole, and mercaptoimidazoline), thiazole derivatives (thiazole, mercaptothiazole, benzothiazole, mercaptobenzothiazole, mercaptonaphthothiazole, thiazoline, mercaptothiazoline, thiazolone and mercaptothiazolone), thiadiazole derivatives (thiadiazole), triazinethiol derivatives (triazinethiol), mercaptotriazole derivatives (mercaptotriazole and dimercaptotriazole), and mercaptotetrazole derivatives (mercaptotetrazole). Among them, compounds containing sulfur atoms in the molecule are higher in affinity with the metal compound and discoloration resistance, and thus, used favorably. More preferably, mercaptans, mercaptopropionic acid derivatives, sulfides and disulfides are favorable.

Typical examples of the imidazoles exemplified above as the compounds containing nitrogen atoms and/or sulfur atoms in the molecule include 2-phenylimidazole, 2-phenyl-4-methylimidazole, 2-phenyl-4-propylimidazole, 2-phenyl-5-iodoimidazole, 2-benzylimidazole, 2-benzyl-4-methylimidazole, 2-(3-chloro)benzylimidazole, 2-(3-iodo)benzylimidazole, 2-naphthylimidazole, 2-naphthyl-4-methylimidazole, 2-naphthyl-4-methyl-5-bromoimidazole, 2-(3,5-dibromo)naphthylimidazole, 2-(2,6-dichloro)naphthyl-4-methylimidazole, 2-amylimidazole, 2-heptylimidazole, 2-decylimidazole, 2-undecylimidazole, 2-dodecylimidazole, 2-tetradecylimidazole, 2-heptadecylimidazole, 2-undecyl-4-methylimidazole, and 2-heptadecyl-4-methylimidazole.

Typical examples of the triazole derivatives include benzotriazoles such as benzotriazole, 1-methylbenzotriazole, 4-methylbenzotriazole, 1-ethylbenzotriazole, 1-hydroxybenzotriazole, 4-carboxybenzotriazole, 1-chlorobenzotriazole, 5-chlorobenzotriazole, N-acetyl-benzotriazole, N-butyryl-benzotriazole, N-pivaloyl-benzotriazole, N-nonanoylbenzotriazole, N-caproylbenzotriazole, N-lauroylbenzotriazole, N-stearylbenzotriazole, N-oleoylbenzotriazole, naphthotriazole, tolyltriazole, 2-(2'-hydroxy-5'-methylphenyl)benzotriazole, 2-(2'-hydroxy-3,5'-di-tert-butylphenyl)benzotriazole, (di)ethylaminomethylbenzotriazole, (di)butylaminomethylbenzotriazole, (di)octylaminomethylbenzotriazole, (di)tridecylaminomethylbenzotriazole, (di)octadecylaminomethylbenzotriazole, (di)cyclohexylaminomethylbenzotriazole, (di)allylaminomethylbenzotriazole, (di)benzylaminomethylbenzotriazole, (di)octylaminoethylbenzotriazole, (di)octylaminodecylbenzotriazole, and (di)octylaminobenzylbenzotriazole; and alkylaminotriazoles such as 3-amino-1,2,4-triazole, 3-amino-5-methyl-1,2,4-triazole, 3-amino-5-ethyl-1,2,4-triazole, 3-amino-5-propyl-1,2,4-triazole, 3-amino-5-butyl-1,2,4-triazole, 3-amino-5-pentyl-1,2,4-triazole, 3-amino-5-hexyl-1,2,4-triazole, 3-amino-5-heptyl-1,2,4-triazole, 3-amino-5-octyl-1,2,4-triazole, 3-amino-5-nonyl-1,2,4-triazole, 3-amino-5-decyl-1,2,4-triazole, 3-amino-5-undecyl-1,2,4-triazole, and 3-amino-5-dodecyl-1,2,4-triazole.

Typical examples of the tetazole derivatives include tetrazoles such as tetrazole, 1H-tetrazole, 1-methyltetrazole, 1-ethyltetrazole, 1-phenyltetrazole, 2-methyltetrazole, 2-ethyltetrazole, 5-methyltetrazole, 1,5-dimethyltetrazole, 1-methyl-5-ethyltetrazole, 5-methoxytetrazole, 1-methyl-5-methoxytetrazole, 2-ethyl-5-methoxytetrazole, 5-aminotetrazole, 5-amino-2-phenyltetrazole, 2-methyl-5-nitrotetrazole, 1-methyl-5-phenylaminotetrazole, 1-methyl-5-methylaminotetrazole, 2-phenyltetrazole, 5-phenyltetrazole, 1,5-diphenyltetrazole, 2,5-diphenyltetrazole, 1,5-cyclotrimethylenetetrazole, 1,5-cyclotetramethylenetetrazole, 1,5-cyclopentamethylenetetrazole, 5-chloromethyl-1-phenyltetrazole, 5-brominetetrazole, 1-oxytetrazole, 1,4-dioxy-5-phenyltetrazole, 5-oxytetrazole, 5-oxy-1-methyltetrazole, 5-oxy-2-methyltetrazole, 2-oxy-5-phenyltetrazole, 1-amino-5-phenyltetrazole, 5-amino-2-phenyltetrazole, 5-amino-1-methyltetrazole, 5-amino-2-methyltetrazole, 1-methyl-5-methoxytetrazole, 1-methyl-5-N,N-dimethylaminotetrazole, 1,4-dimethyl-5-methyliminotetrazole, 1,3-dimethyl-5-iminotetrazole, 1,5-diaminotetrazole, 1-amino-5-anilinotetrazole, 5-hydrazinotetrazole, 1-amino-5-hydrazinotetrazole, 5-acetyl-1-phenyltetrazole, 5-tetrazolecarboxylic acid, 5-tetrazolecarboxylic amide, 5-cyanotetrazole, 1-phenyl-5-tetrazolecarboxylic acid, 2-ethyl-5-tetrazolecarboxylic acid, 2-phenyl-5-tetrazolecarboxylic acid, 1-phenyl-5-tetrazolyl acetic acid, 1-phenyl-5-tetrazolyl pyruvic acid, 1-N,N-dimethylaminoether-tetrazole, and 5-tetrazolesulfonic acid; and tetrazolones and tetrazolium salts such as tetrazolone, 1,3-dimethyl-5-tetrazolone, 1,4-dimethyl-5-tetrazolone, 2,3-diphenyltetrazolium chloride, 5-oxy-2,3-diphenyltetrazolium, 2,3-diphenyltetrazolium hydroxide, 2,3,5-triphenyltetrazolium chloride, 5-amino-2,3-diphenyltetrazolium chloride, 5-carboxy-2,3-diphenyltetrazolium chloride salt.

Examples of the selenadiazoles include 3,5-diphenyl-1,2,4-selenadiazole, 2,5-dimethyl-1,3,4-selenadiazole, and 2,5-diphenyl-1,3,4-selenadiazole.

Examples of the higher alkylamines and the ethyleneoxide adducts include dodecylamine, octadecylamine, eicosylamine, and nonylamine.

Examples of the α- or β-dicarbonyl compounds or the amine adducts thereof include glyoxal, pyruvaldehyde, diacetyl, 2,3-pentandione, 3,4-hexandione, 3,4-heptandione, 3,4-octandione, 4,5-nonandione, 4,5-decandione, 5,6-undecandione, 1,2-cyclohexandione, acetylacetone, 2,4-hexandione, 2,4-heptandione, 2,4-octandione, 3,5-octandione, 4,6-decandione, 5,7-undecandione, methyl acetoacetate, ethyl acetoacetate, 3-methyl-2,4-pentandione, 2-acetylcyclopentanone, α-acetyl-γ-butylolactone, 2-ethylcarbonylcyclopentanone, α-ethylcarbonyl-γ-butylolactone, 2-propylcarbonylcyclopentanone, α-propylcarbonyl-γ-butylolactone, 2-butylcarbonylcyclopentanone, α-butylcarbonyl-γ-butylolactone, 2-acetylcyclohexanone, α-acetyl-δ-pentylolactone, 2-ethylcarbonylcyclohexanone, α-ethylcarbonyl-γ-pentylolactone, 2-propylcarbonylcyclohexanone, α-propylcarbonyl-γ-pentylolactone, 2-butylcarbonylcyclohexanone, and α-butylcarbonyl-γ-pentylolactone.

Examples of the aliphatic thiol compounds include aliphatic compounds such as 1,1,3,3-tetramethyldecanethiol, 1,1,3,3-tetramethylbutane-1-thiol, 1,10-decanedithiol, 1,2-ethanedithiol, 1,3-propanedithiol, 1,4-butanedithiol, 1,6-hexanedithiol, 1,9-nonanedithiol, 1-octanethiol, 1-decanethiol, 1-dodecanethiol, 1-butanethiol, 1-butanethiol copper (II) salt, 1-propanethiol, 1-hexadecanethiol, 1-hexanethiol, 1-heptanethiol, 1-pentanethiol, 2-diethylaminoethanethiol hydrochloride salt, 2-butanethiol, 2-propanethiol, 2-propene-1-thiol, 2-methyl-1-propanethiol, 2-methyl-2-propanethiol, 2-methyl-2-propene-1-thiol, n-nonanethiol, t-tetradecanethiol, t-dodecanethiol, t-nonanethiol, t-hexadecanethiol, ethanethiol, glutathione, reduced form glutathione, cysteamine hydrochloride salts, cysteamine sulfate salts, cysteine (L-cysteine, D-cysteine, and the mixtures thereof), cysteine derivatives, cysteic acid, cysteic acid ethyl ester hydrochloride salt, dithioerythritol, thioacetyl acid, thiomalic acid, phenothiol, methylmercaptan, mercaptoacetyl acid, and mercaptoethanol; thioglycolic acid derivatives such as thioglycolic acid, ammonium thioglycolate, monoethanolamine thioglycolate, methyl thioglycolate, octyl thioglycolate, methoxybutyl thioglycolate, ethylene glycol bisthioglycolate, butanediol bisthioglycolate, trimethylolpropane tristhioglycolate, and pentaerythritol tetrakisthioglycolate; mercaptopropionic acid derivatives such as 3-mercaptopropionic acid, methyl mercaptopropionate, octyl mercaptopropionate, methoxybutyl mercaptopropionate, decyl mercaptopropionate, butanediol bisthiopropionate, ethylene glycol bisthiopropionate, ethylene glycol bisthiopropionate, trimethylolpropane tristhiopropionate, and pentaerythritol tetrakisthiopropionate; and mercaptan compounds such as mercaptoimidazoline, naphthylmercaptan, and $C_6$ to $C_{22}$-alkylmercaptans.

Examples of the alicyclic or aromatic thiol compounds include 1,2-benzenedithiol, 1,3-benzenedithiol, 1,4-benzene-dimethanethiol, 2,5-dichlorobenzenethiol, 2-aminothiophenol, 2-naphthalenethiol, 2-bromothiophenol, 2-methoxybenzenethiol, 3,4-dichlorobenzenethiol, 3-phenyl-1-propanethiol, 3-methoxybenzenethiol, 4-methoxy-α-toluenethiol, 4-methoxybenzenethiol, o-mercaptobenzoic acid, p-chlorophenylmethanethiol, p-cyclohexylmethanethiol, p-methoxybenzyl-S-(4,6-dimethyl-pyridine-2-nyl)thiolcarbanate, cyclohexylmethanethiol, cyclohexylmercaptan, triphenylmethanethiol, toluene-α-thiol, and hinokithiol.

Examples of the sulfides include sulfides such as diallylsulfide, dihexylsulfide, thiodipropionitrile, thiodipropionic acid, dioctyl thiodipropionate, dimethyl thiodipropionate, diphenylsulfide, dibutylsulfide, dimethylsulfide, bis[2-(methacryloylthio)ethyl]sulfide, bis(2-chloroethyl)sulfide, bis(4-hydroxyphenyl)sulfide, bis(4-methacryloylthiophenyl)sulfide, bis(β-mercaptoethyl) sulfide, ethyl methylthiopropionate, and 1,2-bis(2-hydroxyethylthio)ethane; and disulfides such as diallyldisulfide, diphenylsulfide, ditertiary-butyldisulfide, and 3,3'-dithiodipropionic acid.

Examples of the mercaptoimidazole derivatives include mercaptoimidazoles such as 2-mercaptoimidazole, 2-mercapto-1-methylimidazole, 2-mercapto-4-imidazolecarboxylic acid, 2-mercapto-1,4-dimethylimidazole, 2-mercapto-1,5-dimethylimidazole, 2-mercapto-4,5-dimethylimidazole, 2-mercapto-1-phenylimidazole, 2-mercapto-4-phenylimidazole, and 2-mercapto-4-methylimidazole; mercaptobenzimidazoles such as 2-mercaptobenzimidazole and 2-mercaptomethylbenzimidazole; and imidazolines or mercaptoimidazolines such as 2-mercaptoimidazoline.

Examples of the thiazole derivatives include thiazoles such as thiazole, 2,4-dimethylthiazole, 2,5-dimethylthiazole, 4,5-dimethylthiazole, 2,4-dimethyl-5-nitrothiazole, 2,5-dimethyl-4-nitrothiazole, 5-methyl-4-(p-nitrophenyl)thiazole, 2-methyl-4-phenylthiazole, 4-methyl-5-phenylthiazole, 5-methyl-4-phenylthiazole, 2-methoxy-4-methylthiazole, 5-methoxy-4-methylthiazole and 4-methyl-2-phenylazothiazole; mercaptothiazoles such as 2-mercaptothiazole, 2-mercapto-4-methylthiazole, 2-mercapto-4,5-dimethylthiazole, 2-mercapto-4-phenylthiazole, 5-mercapto-3-(β-phthalimidoethyl)thiazole, 2-mercapto-4-methyl-5-thiazolecarboxylic acid, and 4-methyl-2-methylmercaptothiazole; benzothiazoles such as benzothiazole, 2-methylbenzothiazole, 2-(4'-morpholinodithio)benzothiazole, N-cyclohexyl-2-benzothiazolylsulfenamide, N-oxydiethylene-2-benzothiazolylsulfenamide, N-tert-butyl-2-benzothiazolylsulfenamide, 4-methyl-2-benzothiazolecarboxylic acid, 6-methyl-2-benzothiazolecarboxylic acid, 2-methylbenzothiazole iodoethylate and 2,6-dimethylbenzothiazole; mercaptobenzothiazoles such as 2-mercaptobenzothiazole and 2-mercapto-4-methoxybenzothiazole; mercaptonaphthothiazoles such as 2-mercaptonaphtho[1,2]thiazole and 2-mercaptonaphtho[2,1]thiazole; thiazolines or mercaptothiazolines such as 3-methyl-2-methylenemercaptothiazoline, 2-mercapto-4-methyl-2-thiazoline, and 2-mercapto-5-methyl-2-thiazoline; and thiazolones or mercaptothiazolones such as thiazolone and 2-mercapto-5-thiazolone.

Examples of the thiadiazole derivatives include thiadiazoles such as 1,2,3-thiadiazole, 1,2,4-thiadiazole, 1,3,4-thiadiazole, 1,2,3-thiadiazole-4-carboxylic acid, 1,2,3-thiadiazole-4,5-dicarboxylic acid, 1,3,5-thiadiazole-2,5-disulfonic acid, 5,5'-dimethyl-2,2'-bis(1,3,4-thiadiazole), 2-mercapto-1,3,4-thiadiazole, 2-mercapto-5-methyl-1,3,4-thiadiazole, 2-mercapto-5-ethyl-1,3,4-thiadiazole, 2-mercapto-5-phenyl-1,3,4-thiadiazole, 5-mercapto-3-phenyl-1,2,4-thiadiazole, 2-mercapto-5-methylthio-1,3,4-thiadiazole, 2-mercaptobenzothiadiazole, 2,5-dimercapto-1,3,4-thiadiazole, 3,5-dimercapto-1,2,4-thiadiazole, 5-methyl-1,2,3-thiadiazole, 5-phenyl-1,2,3-thiadiazole, 4,5-diphenyl-1,2,3-thiadiazole, 5-methyl-1,2,3-thiadiazole-4-carboxylic acid, 5-phenyl-1,2,3-thiadiazole-4-carboxylic acid, 1,2,3-benzothiadiazole, 4-oxy-1,2,3-benzothiadiazole, 5-oxy-1,2,3-benzothiadiazole, 6-oxy-1,2,3-benzothiadiazole, 4-amino-1,2,3-thiadiazole, 3,5-diphenyl-1,2,4-thiadiazole, 5-anilino-3-phenyl-1,2,4-thiadiazole, bis[5-chloro-3-(1,2,4-thiadiazolyl)]disulfide, 5-amino-1,2,4-thiadiazole, 5-imino-4-methyl-1,2,4-thiadiazoline, 2-phenyl-1,3,4-thiadiazole, 2,5-dimethyl-1,3,4-thiadiazole, 5,5'-diphenyl-2,2'-bis(1,3,4-thiadiazole), 2-oxy-5-phenyl-1,3,4-thiadiazole, 3-phenyl-5-mercapto-1,3,4-thiadiazole-2-thione, 2-amino-1,3,4-thiadiazole, 2-amino-5-methyl-1,3,4-thiadiazole, 2-amino-5-phenyl-1,3,4-thiadiazole, 2-amino-5-oxy-1,3,4-thiadiazole, 2-amino-5-aminomethyl-1,3,4-thiadiazole, 2-amino-5-(β-aminoethyl)-1,3,4-thiadiazole, 2,5-diamino-1,3,4-thiadiazole, 5-imino-2,4-diphenyl-δ-1,3,4-thiadiazoline, 2-mercapto-5-methylthio-1,3,4-thiadiazole, 2-methyl-5-mercapto-1,3,4-thiadiazole, 2-benzylmercapto-1,3,4-thiadiazole, 2-amino-5-mercapto-1,3,4-thiadiazole, 2-mercapto-4-phenyl-1,3,4-thiadiazoline-5-thione, 2-thioacetic acid-5-mercapto-1,3,4-thiadiazole, 2,5-dithioacetic acid-5-mercapto-1,3,4-thiadiazole, and 2,5-dithioacetic acid-1,3,4-thiadiazole; and thiadiazolones such as 2-mercapto-1,3,4-thiadia-5-zolone, 2-mercapto-4-methyl-1,3,4-thiadia-5-zolone, 2-mercapto-4-phenyl-1,3,4-thiadia-5-zolone, 2-amino-4-mercapto-1,3,4-thiadia-5-zolone, 2-oxy-4-phenyl-1,3,4-thiadia-5-zolone, and 2-isopropyl-4-benzyl-1,3,4-thiadia-5-zolone.

Examples of the triazine thiol derivatives include 1,3,5-triazine-2,4,6-trithiol, 6-anilino-1,3,5-triazine-2,4-dithiol, 6-dimethylamino-1,35-triazine-2,4-dithiol, 6-diethylamino-1,35-triazine-2,4-dithiol, 6-dibutylamino-1,35-triazine-2,4-dithiol, 6-dioctylamino-1,35-triazine-2,4-dithiol, 6-dilaurylamino-1,35-triazine-2,4-dithiol, and 6-distearylamino-1,35-triazine-2,4-dithiol.

Examples of the mercaptotriazole derivatives include mercaptotriazoles such as 3-mercapto-1,5-diphenyl-1,2,4-triazole, 3-mercapto-1,2,4-triazole, 3-mercapto-4-methyl-1,2,4-triazole, 3-mercapto-1-phenyl-1,2,4-triazole, 5-mercapto-1-phenyl-1,2,4-triazole, and 5-mercapto-1,2,4-triazole-3-acetic acid; and dimercaptotriazoles such as 3,5-dimercapto-1,2,4-triazole, 3,5-dimercapto-1-phenyl-1,2,4-triazole, and 3,5-dimercapto-1,4-diphenyl-1,2,4-triazole.

Examples of the mercaptotetazole derivatives include mercaptotetrazoles such as 1-methyl-5-mercaptotetrazole, 1-cyclohexyl-5-mercaptotetrazole, 1-carboxymethyl-5-mercaptotetrazole, 1-phenyl-5-mercaptotetrazole, 5-mercaptotetrazole, 5-mercapto-1-methyltetrazole, 5-mercapto-1-ethyltetrazole, 5-mercapto-1-carboxymethyltetrazole, 5-mercapto-1-cyclohexyltetrazole, 5-mercapto-1-phenyltetrazole, 5-mercapto-1-(hydroxyphenyl)tetrazole, 5-mercapto-1-(acetamidophenyl)tetrazole, 3-(4,5-dimethyl-2-thiazolyl)2,5-diphenyl-2H-tetrazolium bromide, and 5-amino-1H-tetrazole.

The compounds may be used alone or in combination of two or more.

The addition amount of the compound effective in preventing metal discoloration according to the present invention is not particularly limited, but preferably 0.01 to 40 parts by weight with respect to 100 parts by weight of the metal fine particles. When the metal fine particles according to the present invention are used as the conductive material, it is more preferably 0.1 to 20 parts by weight. An addition amount of less than 0.01 part by weight is unfavorable, because it results in insufficient discoloration prevention efficiency. Alternatively, an addition amount of more than 40 parts by weight is also unfavorable, as it leads to saturation of the discoloration-preventing efficiency and no more favorable effects by addition, and also to deterioration in the conductivity and other properties of film because of the presence of the compounds not involved in discoloration prevention.

In the method for producing a fine metal particle dispersion according to the present invention, the reductive reaction is preferably carried out in the presence of a dispersant. The dispersant is considered to be present at the interface of the non-polar solvent phase and the non-polar solvent with the aqueous phase, helping extraction of the metal fine particles from the aqueous phase and stabilizing the extracted metal fine particles.

The dispersant is, for example, a compound having one or more groups showing affinity with the pigment and the metal surface, and typically, it is a compound commonly used as pigment dispersant. The affinity group may vary according to the kinds of the pigment and the metal, but generally it is, but not limited to, for example, a polar group such as amino, quaternary ammonium, hydroxyl, cyano, carboxyl, thiol, or sulfonic acid. The affinity groups may be bound to the main chain, the side-chains, or both of the side and main chains.

The affinity group-containing compound is not particularly limited and favorable examples thereof include amine compounds, pigment dispersant, surfactants, and fatty acids.

The amine compound is not particularly limited, and examples thereof include aliphatic amines such as propylamine, butylamine, hexylamine, diethylamine, dipropylamine, dimethylethylamine, diethylmethylamine, triethylamine, ethylenediamine, N,N,N',N'-tetramethylethylenediamine, 1,3-diaminopropane, triethylenetetramine, tetraethylenepentamine; alicyclic amines such as piperidine, N-methylpiperidine, piperazine, N,N'-dimethylpiperazine, pyrrolidine, N-methylpyrrolidine, and morpholine; aromatic amines such as aniline, N-methylaniline, N,N-dimethylaniline, toluidine, anisidine, and phenetidine; aralkylamines such as benzylamine, N-methylbenzylamine, N,N-dimethylbenzylamine, phenethylamine, xylylenediamine, and N,N,N',N'-tetramethylxylylenediamine; and alkanolamines such as methylaminoethanol, dimethylaminoethanol, diethylaminoethanol, triethanolamine, ethanolamine, diethanolamine, methyl diethanolamine, propanolamine, 2-(3-aminopropylamino)ethanol, butanolamine, hexanolamine, and dimethylaminopropanol. Among them, alkanolamines are preferable. These compounds may be used alone or in combination of two or more. Alternatively, an amine compound and a non-amine compound may be used in combination.

The pigment dispersant is not particularly limited, and any one of common commercially available pigment dispersants may be used, and examples thereof include, but are not limited to, Solsperse 3000, Solsperse 9000, Solsperse 17000, Solsperse 24000, Solsperse 28000, Solsperse 32000, Solsperse 35100, Solsperse 36000, and Solsperse 41000, manufactured by Lubrizol Corporation; EFKA4009, EFKA4046, EFKA4047, EFKA4080, EFKA4010, EFKA4015, EFKA4050, EFKA4055, EFKA4060, EFKA4330, EFKA4300, and EFKA7462, manufactured by EFKA Additives; Ajisper PB821, Ajisper PB711, Ajisper PB822, Ajisper PN411, and Ajisper PA111, manufactured by Ajinomoto FineTechno Co. Inc.; TEXAPHORUV20, TEXAPHORUV21, TEXAPHORP61, manufactured by Cognis Japan Ltd.; and Disperbyk-101, Disperbyk-103, Disperbyk-106, Disperbyk-110, Disperbyk-111, Disperbyk-161, Disperbyk-162, Disperbyk-163, Disperbyk-164, Disperbyk-166, Disperbyk-167, Disperbyk-168, Disperbyk-170, Disperbyk-171, Disperbyk-174, Disperbyk-180, and Disperbyk-182, manufactured by BYK Japan K.K. These pigment dispersants may be used alone or in combination of two or more. Alternatively, a pigment dispersant and the non-pigment dispersant compound above may be used in combination.

Surfactants are substances commonly having both polar and non-polar groups, are grouped into anionic, nonionic, amphoteric, cationic surfactants, according to the structure of the polar group. Such a surfactant, which is present stably in solvent as it forms micelles and helps solubilization of particles as it is adsorbed thereon, is used favorably as a dispersion stabilizer for pigments and inorganic fine particles.

When a surfactant is used in the method for producing a fine metal particle dispersion according to the present invention, the surfactant is not particularly limited, and any one of commonly commercially available surfactants may be used. Examples thereof include anionic activators such as higher fatty acid salts, α-sulfofatty acid methyl ester salts, alkylbenzenesulfonate salts, alkylsulfate ester salts, alkylether sulfate ester salts, monoalkylphosphate ester salts, α-oleinsulfonate salts, and alkanesulfonate salts; nonionic surfactants such as glycerol fatty acid esters, sucrose fatty acid esters, sorbitan fatty acid esters, polyoxyethylene sorbitan fatty acid esters, polyoxyethylene fatty acid esters, fatty acid alkanolamides, polyoxyethylene alkylethers, alkylglucosides, and polyoxyethylene alkylphenylethers; amphoteric surfactants such as alkylaminofatty acid salts, alkylbetaines, and alkylamine oxides; and cationic surfactants such as alkyltrimethylammonium salts, dialkyldimethylammonium salts, alkyl dimethylbenzylammonium salts, and N-methylbishydroxyethylamine fatty acid ester hydrochloride salts.

Other examples thereof for use include fluorochemical surfactants, reactive activators such as allyl-based reactive surfactants, and polymer surfactants such as cationic cellulose derivatives, polycarboxylic acids, and polystyrenesulfonic acids. These are commercially available as wet dispersants, and examples thereof include EFKA5010, EFKA5044, EFKA5244, EFKA5054, EFKA5055, EFKA5063, EFKA5064, EFKA5065, EFKA5066, EFKA5070, EFKA5071, and EFKA5207 manufactured by EFKA Additives; and Disperbyk-101, Disperbyk-108, and Disperbyk-130 manufactured by BKY Japan K.K. These surfactant may be used alone or in combination of two or more. Alternatively, a surfactant and the non-surfactant compound above may be used in combination.

The fatty acid for use as the dispersant is not particularly limited, and any one of common known fatty acids may be used, and it may be the same as or different from the fatty acid used during preparation of the metal fine particles. Examples of the fatty acids include, but are not particularly limited to, straight-chain saturated fatty acids including propionic acid, butyric acid, valeric acid, caproic acid, enanthic acid, caprylic acid, pelargonic acid, capric acid, undecanoic acid, lauric acid, tridecanoic acid, myristic acid, pentadecanoic acid, palmitic acid, heptadecanoic acid, stearic acid, nonadecanoic acid, arachic acid, behenic acid, rignoceric acid, cerotic acid, heptacosanoic acid, montanic acid, melissic acid, and laccelic acid. Examples of the straight-chain unsaturated fatty acids include acrylic acid, crotonic acid, isocrotonic acid, undecylenoic acid, oleic acid, elaidic acid, cetoleic acid, erucic acid, brassidic acid, sorbic acid, linolic acid, linolenic acid, arachidonic acid, propiolic acid, and stearolic acid. Among them, caproic acid, enanthic acid, caprylic acid, myristic acid, oleic acid, stearic acid, and the like are preferable, from the viewpoints of stability and low-temperature degradability.

Examples of the branched fatty acids include 2-ethylhexanoic acid, 2-ethylisohexanoic acid, 2-propylheptanoic acid, 2-butyloctanoic acid, 2-isobutylisooctanoic acid, 2-pentylnonanoic acid, 2-isopentylnonanoic acid, 2-hexyldecanoic acid, 2-hexylisodecanoic acid, 2-butyldodecanoic acid, 2-isobutyldodecanoic acid, 2-heptylundecanoic acid, 2-isoheptylundecanoic acid, 2-isoheptylisoundecanoic acid, 2-dodecylhexanoic acid, 2-isododecylhexanoic acid, 2-octyldodecanoic acid, 2-isooctyldodecanoic acid, 2-octylisododecanoic acid, 2-nonyltridecanoic acid, 2-isononylisotridecanoic acid, 2-decyldodecanoic acid, 2-isodecyldodecanoic acid, 2-decylisododecanoic acid, 2-decyltetradecanoic acid, 2-octylhexadecanoic acid, 2-isooctylhexadecanoic acid, 2-undecylpentadecanoic acid, 2-isoundecylpentadecanoic acid, 2-dodecyl heptadecanoic acid, 2-isododecylisoheptadecanoic acid, 2-decyloctadecanoic acid, 2-decylisooctadecanoic acid, 2-tridecylheptadecanoic acid, 2-isotridecylisoheptadecanoic acid, 2-tetradecyloctadecanoic acid, 2-isotetradecyloctadecanoic acid, 2-hexadecylhexadecanoic acid, 2-hexadecyltetradecanoic acid, 2-hexadecylisohexadecanoic acid, 2-isohexadecylisohexadecanoic acid, 2-pentadecylnonadecanoic acid, 2-isopentadecylisononadecanoic acid, 2-tetradecylbehenic acid, 2-isotetradecylbehenic acid, 2-tetradecylisobehenic acid, and 2-isotetradecylisobehenic acid.

Examples of the tertiary fatty acids include pivalic acid, neononanoic acid, neodecanoic acid, Ekacid 9 (manufactured by Idemitsu Petrochemical Company), and Ekacid 13 (manufactured by Idemitsu Petrochemical Company).

These fatty acids may be used alone or in combination of two or more. Alternatively, a fatty acid and the non-fat acid compound above may be used in combination.

The addition amount of the dispersant is not particularly limited, but the amount of the all dispersants when added is preferably 1 to 2000 parts by weight, more preferably 10 to 100 parts by weight, with respect to 100 parts by weight of the metal fine particles. An addition amount of less than 1 part by weight results in insufficient effect by addition of the dispersant, while an addition amount of more than 2000 parts by weight leads to excessive presence of the dispersant not effective for stabilization, which is undesirable economically, and to adverse effects such as deterioration in metal concentration of the dispersion and also in conductivity.

In the production method according to the present invention, the reductive reaction may be carried out in the presence of an extracting agent. The extracting agent is favorably a sulfur compound or an amine compound that is preferably soluble in nonaqueous solvents. The extracting agent helps extraction of the reduced metal fine particles from the aqueous phase into the nonaqueous solvent phase and improves the yield of the metal fine particles. After extraction of the fine metal particles into the nonaqueous solvent phase, the extracting agent, which is present near the fine metal particle surface, exerts various favorable effects on the compounds added.

The reductive reaction in the method for producing a fine metal particle dispersion according to the present invention progresses sufficiently even at room temperature, but may be carried out under heat. However, excessively high temperature leads to faster Brownian movement of the metal particle and higher possibility of aggregation and also to concern about thermal denaturation of the dispersant when used, and thus, the reductive reaction is preferably carried out at 90° C. or lower, more preferably at 70° C. or lower.

In the method for producing a fine metal particle dispersion according to the present invention, the reaction may be carried out under ambient air throughout the reaction, but may be carried out under an inert gas atmosphere such as of nitrogen or argon, for prevention of oxidation and sulfidization of the generated metal fine particles or side reactions in the presence of oxygen.

In the method for producing a fine metal particle dispersion according to the present invention, the dispersion may be condensed as needed to a desired concentration, by removing some of the nonaqueous solvent for example by distillation under heat and reduced pressure after separation of the aqueous phase. Alternatively according to applications, the metal particles may, after complete removal of the nonaqueous solvent, be redispersed in a solvent different from that used during synthesis, to give a metal particle dispersion at a desired concentration. The solvent then may be a nonaqueous solvent or an aqueous solvent, but is preferably a solvent dissolving the fatty acid which is present near the metal fine particles or the dispersant if present.

The method for removing the nonaqueous solvent is not particularly limited, but, for example when distillation under heat and reduced pressure and a dispersant are used, a poor solvent not dissolving the dispersant may be added for precipitation of the metal fine particles and separation of the solid, and then the solid redispersed in a desired solvent, according to the dispersant used.

The particle diameter of the metal fine particles produced by the method according to the present invention can be adjusted, as needed, but preferably 0.1 to 200 nm, more preferably 1 to nm. For preparation of a conductive film by fusion at low temperature, the particle diameter of the metal fine particles is preferably 1 to 80 nm. The particle diameter can be adjusted by adjusting the reaction condition during particle synthesis, the concentrations of the reducing agent, pigment dispersant, and raw materials, and others.

The shape of the fine metal particles produced by the production method according to the present invention may vary according to the kinds of the materials and liquid mediums used as raw materials and the conditions such as reduction condition, and is preferably spherical or almost spherical as the dispersion shows good stability and good conductivity when the particle is used a conductive material.

Hereinafter, the conductive resin composition and the conductive ink according to the present invention will be described.

The conductive resin composition and the conductive ink according to the present invention contain the fine metal particle dispersion produced by the method according to the present invention. For preparation of a favorable conductive film, it preferably contains fewer components other than the fine metal particle dispersion. The fine metal particle dispersion produced by the production method according to the present invention may be called a kind of film forming material such as ink or conductive paint, because it is possible to form a conductive film by forming a thin film of the fine metal particle dispersion produced by the production method according to the present invention on a base material and sintering the resulting thin film. However, considering the printability or coatability of the dispersion, and film-forming property of the conductive film, it is preferably used in the form of resin composition or printing ink. When producing a resin composition or a printing ink, there may be contained a carrier of a resin, its precursor, or the mixture thereof and, as needed, a metal powder or a conductive powder other than the metal powder above, various commonly used additives such as plasticizer, lubricant, dispersant, leveling agent, antifoaming agent, antistatic agent, antioxidant, and chelating agent, and various liquid media, in the ranges wherein the solubility of the dispersant which coats the fine metal particles is not impaired for providing properties as a resin composition or a printing ink and improvement thereof.

The shape of the metal powder as additive may be leaf-shaped, flaky, spherical, almost spherical, spicular, scaly, plate-shaped, arborescent or the like, and a mixture of powders in various shapes may also be used. The powder is preferably a flaky or spherical metal powder from the viewpoints of ink conductivity and fluidity. The flaky metal powder preferably has an average particle diameter of 1 to 10 µm as determined by laser diffraction. The spherical metal powder preferably has an average particle diameter of 1 to 10 µm, but a powder containing secondary agglomerates may also be used. In the case of a flaky powder, the powder preferably has a tap density of 2.0 to 6.0 g/cm$^3$ and a specific surface area of 0.2 to 2.0 m$^2$/g, while, in the case of a spherical powder, the powder preferably has a tap density of 1.5 to 6.0 g/cm$^3$ and a specific surface area of 0.1 to 2.5 m$^2$/g. A conductive ink containing a fine metal particle dispersion and flaky and/or spherical metal powders, in which the fine metal particles function as a roller for the flaky and/or spherical metal powders, improves the fluidity of the conductive ink. Simultaneously, it also results in close packing of the conductive substance, giving a low resistivity even at low temperature. Examples of the other conductive powders include metal-coated inorganic material powders, metal oxides such as silver oxide, indium oxide, antimony oxide, zinc oxide, tin oxide, antimony-doped tin oxide, and indium-tin mixed oxide; and carbon black, graphite. These conductive substances may be used in combination of two or more.

The carrier of resins, the resin precursors or the mixture thereof has functions to adhering conductive substances such as fine metal particles and metal powder onto various base material and to provide favorable physical properties or the properties as printing ink or a resin composition.

Examples of the resins include polyurethane resins, polyester resins, alkyd resins, butyral resins, acetal resins, polyamide resins, acrylic resins, styrene/acrylic resins, styrene resins, nitrocellulose, benzylcellulose, cellulose (tri)acetate, casein, shellac, gilsonite, gelatin, styrene-maleic anhydride resins, polybutadiene resins, polyvinyl chloride resins, poly (vinylidene chloride) resins, poly(vinylidene fluoride) resins, poly(vinyl acetate) resins, ethylene vinyl acetate resins, vinyl chloride/vinyl acetate copolymer resins, vinyl chloride/vinyl acetate/maleic acid copolymer resins, fluoroplastics, silicone resins, epoxy resins, phenoxy resins, phenol resins, maleic acid resins, urea resins, melamine resins, benzoguanamine resins, ketone resins, petroleum resins, rosins, rosin esters, poly(vinyl alcohol), polyvinylpyrrolidone, polyacrylamide, hydroxyethyl cellulose, hydroxypropyl cellulose, methyl cellulose, ethyl cellulose, hydroxyethylmethyl cellulose, hydroxypropylmethyl cellulose, carboxymethyl cellulose, carboxymethylethyl cellulose, carboxymethyl nitrocellulose, ethylene/vinyl alcohol resins, chlorinated polyolefin resins, modified chlorinated polyolefin resins, and chlorinated polyurethane resins, and one or more of the resins selected from these may be used according to the kind of the printing or application method, the kind of the base material, and applications. These resins may be tacky.

The Examples of the resin precursors include compounds having one or more ethylenic unsaturated double bonds such as (meth)acrylic acid, a (meth)acrylate compound, a vinyl ether compound, and a polyallyl compound. These compounds may be used alone or in combination of two or more thereof.

When a liquid resin precursor as the carrier is contained in the conductive ink or the conductive resin composition according to the present invention, the conductive ink or the conductive resin composition may be prepared as a solvent-free ink or resin composition that is cured by irradiation of active energy ray such as ultraviolet ray or electron beam. Alternatively when it contains a resin but not a liquid precursor of resin as the carrier, it may be prepared as a common heat-drying ink, heat-drying paint or the like by use of a liquid medium for giving printability or coating properties to the conductive ink or the resin composition by dissolving the resin and stabilizing the fine metal particles or the metal powder.

The liquid medium for use in the conductive ink or resin composition according to the present invention is not particularly limited so long as it does not impair the solubility of the dispersant which coats the fine metal particles. As the liquid medium, there may be used, for example, an ester-based solvent, a ketone-based solvent, a glycol ether-based solvent, an aliphatic solvent, an aromatic solvent, an alcoholic solvent, an ether-based solvent, water or the like according to the kinds of the resin as carrier, the conductive film, and the base material for conductive pattern, the printing or application methods and the like, and if needed, two or more of them may be used as a mixture.

Typical examples of the ester-based solvent include ethyl formate, propyl formate, butyl formate, isobutyl formate, pentyl formate, methyl acetate, ethyl acetate, n-propyl acetate, isopropyl acetate, n-butyl acetate, isobutyl acetate, sec-butyl acetate, (iso) amyl acetate, cyclohexyl acetate, ethyl lactate, 3-methoxybutyl acetate, sec-hexyl acetate, 2-ethylbutyl acetate, 2-ethylhexyl acetate, benzyl acetate, methyl propionate, ethyl propionate, butyl propionate, isoamyl propionate, and γ-butyrolactone; and those of the ketone-based solvent include acetone, methyl ethyl ketone, methyl propyl ketone, diethyl ketone, methyl n-butyl ketone, methyl isobutyl ketone, dipropyl ketone, diisobutyl ketone, methyl amyl ketone, acetonylacetone, isophorone, cyclohexanone, and methylcyclohexanone.

Examples of the glycol ether-based solvent include ethylene glycol monoethyl ether, ethylene glycol monoisopropyl ether, ethylene glycol monobutyl ether, diethylene glycol monoethyl ether, diethylene glycol mono-n-butyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, triethylene glycol monomethyl ether, triethylene glycol monoethyl ether, triethylene glycol mono-n-propyl ether, triethylene glycol mono-n-butyl ether, tripropylene glycol monoethyl ether, tripropylene glycol mono-n-propyl ether, tripropylene glycol mono-n-butyl ether, and the acetate esters of these monoethers, and dialkylethers such as diethylene glycol dimethyl ether, diethylene glycol diethyl ether, dipropylene glycol dimethyl ether, and dipropylene glycol diethyl ether.

Examples of the aliphatic solvent include n-paraffin-based solvents such as n-hexane, n-heptane, n-octane, n-nonane, n-decane, n-dodecane, No. 0 Solvents L, M and H (manufactured by Nippon Oil Corp.), and n-Paraffins SL, L and M (Nippon Oil Corp.). Examples of the isoparaffin-based solvent include isohexane, 2,2,3-trimethylpentane, isooctane, 2,2,5-trimethylhexane, Isozoles 200, 300, and 400 (manufactured by Nippon Oil Corp.), and Supersols FP2, 25, 30, and 38 (manufactured by Idemitsu Kosan Co., Ltd.). Examples of the cycloparaffin-based solvent include cyclopentane, methylcyclopentane, cyclohexane, methylcyclohexane, ethylcyclohexane, Naphthezoles 160, 200, and 220 (manufactured by Nippon Oil Corp.), and AF Solvent Nos. 4, 5, 6, and 7 (manufactured by Nippon Oil Corp.).

Examples of the aromatic solvent include toluene, xylene, ethylbenzene, naphthalene, tetralin, and solvent naphtha.

Examples of the alcoholic solvent include methanol, ethanol, n-propyl alcohol, isopropyl alcohol, n-butyl alcohol, isobutyl alcohol, sec-butyl alcohol, t-butyl alcohol, n-amyl alcohol, sec-amyl alcohol, 1-ethyl-1-propanol, 2-methyl-1-butanol, isoamyl alcohol, t-amyl alcohol, sec-isoamyl alcohol, neoamyl alcohol, hexyl alcohol, 2-methyl-1-pentanol, 4-methyl-2-pentanol, heptyl alcohol, octyl alcohol, 2-ethylhexyl alcohol, nonyl alcohol, decyl alcohol, undecyl alcohol, lauryl alcohol, benzyl alcohol, α-terpineol, cyclohexanol, 3-methoxybutanol, and diacetone alcohol.

Examples of the ether-based solvent include cyclic ethers such as tetrahydrofuran and 1,3-dioxolane. Other liquid media include dimethyl carbonate, ethyl methyl carbonate, and di-n-butyl carbonate. The liquid media may be used alone or in combination of two or more thereof.

When the conductive ink or the conductive resin composition according to the present invention containing the resin precursor is cured by irradiation of electron beams, cleavage of the molecular chain in the resin precursor (compound having an ethylenic unsaturated double bond) by the irradiation of electron beams leads the conductive ink or the conductive resin composition to radical polymerization. However, when cured by irradiation of ultraviolet rays, a photopolymerization initiator is usually added to the conductive ink or the conductive resin composition. Examples of the photopolymerization initiator include benzophenone-based initiators, thioxanthone-based initiators, acetophenone-based initiators, benzoin-based initiators, acylphosphine oxide-based initiators, bisimidazole-based initiators, acridine-based initiators, carbazole-phenone-based initiators, triazine-based initiators, and oxime-based initiators.

The conductive ink or the conductive resin composition resin according to the present invention containing a resin precursor may contain additionally a photopolymerization accelerator or a sensitizer as well as the photopolymerization initiator. Examples of the photopolymerization accelerators and sensitizers include aliphatic and aromatic amines such as triethanolamine, triisopropanolamine, 4,4-dimethylaminobenzophenone, ethyl 2-dimethylaminobenzoate, and (n-butoxy)ethyl 4-dimethylaminobenzoate.

In the conductive ink or conductive resin composition according to the present invention containing a resin precursor, there may be contained additionally a (thermal) polymerization inhibitor for improvement in stability of the conductive ink and the conductive resin composition. Examples of the (thermal) polymerization inhibitors include hydroquinone, hydroquinone monomethyl ether, p-benzoquinone, 2,6-t-butyl-p-cresol, 2,3-dimethyl-6-t-butylphenol, anthraquinone, phenothiazine, and N-nitrosophenylhydroxylamine aluminum salt.

The conductive ink or the conductive resin composition according to the present invention may contain, as needed, various commonly used additives such as plasticizer, lubricant, dispersant, leveling agent, antifoaming agent, antistatic agent, antioxidant, and chelating agent. In addition, a commonly used organic or inorganic filler may be added additionally thereto in the range wherein the objects of the invention can be achieved of the present invention. Further, an adhesive component may be added thereto, to make the conductive ink or the resin composition a conductive adhesion composition allowing formation of an adhesive layer.

The conductive ink and the conductive resin composition according to the present invention are produced, for example, in the following manner. Specifically, they are produced by charging a set amount of a fine metal particle dispersion and, as needed, a metal powder into a vessel, adding thereto a resin and/or a resin precursor chosen according to the application and the base material, further adding, as needed, additives such as plasticizer, lubricant, dispersant, leveling agent, antifoaming agent, antistatic agent, antioxidant, and chelating agent, and dispersing the mixture by a known method, for example, using mixer, dissolver, Hoover Muller, three-roll mill, or sand mill. In the conductive ink or the conductive resin composition according to the present invention, there can be easily dispersed additives therein because that its fluidity and dispersion stability are secured by comprising fine metal particles and the metal powder added as needed.

Finally, the conductive film prepared with the conductive ink or the conductive resin composition according to the present invention will be described.

The form of the conductive film is not particularly limited, and, examples thereof include patterns that can be formed by a common printing method or a coated film on entire surface. Examples of the forms of the pattern that can be formed by the printing method include a thin line form, a film form, a lattice form, and a circuit form. As applications thereof, there are illustrated, but are not limited to, a fine conductive circuit, an electromagnetic shield, an electrode, an antenna circuit, a plating alternative, a printed electronic conductive material, and a circuit for a flexible substrate. Examples of forms and applications of the film that can be formed with the conductive resin composition include, but are not limited to, an electromagnetic shield film formed by application as a conductive adhesive on laminating, and an electromagnetic shield film formed on the rear faces of TVs and mobile phones by, for example, spraying.

The conductive film according to the present invention can be formed by printing or applying the conductive ink or the conductive resin composition according to the present invention according to applications, on one face or both faces of a base material such as paper, plastic, or glass by a known method such as a flexographic printing method, a gravure printing method, a gravure offset printing method, an ink jet printing method, an offset printing method, a rotary screen printing method, a letter press method, a spray coating method, a spin coating method, a die coating method, a lip coating method, a knife coating method, a dip coating method, a curtain coating method, a roll coating method, or a bar coating method.

Examples of the base paper materials for use include various processed papers such as coated paper, non-coated paper, synthetic paper, polyethylene-coated paper, impregnated paper, water-resistant paper, non-conductive paper, and processed expandable paper, and use of a coated or processed paper is preferable, for stabilized conductivity of conductive circuits. When used, a coated paper higher in smoothness is preferable for stabilization of the properties of conductive film.

As the base plastic material, there may be used a common base plastic material such as polyester, polyethylene, polypropylene, cellophane, poly(vinyl chloride), poly(vinylidene chloride), polystyrene, poly(vinyl alcohol), an ethylene-vinyl alcohol copolymer, nylon, polyimide, or polycarbonate. For improvement in adhesiveness of the plastic or glass base materials, corona-discharge or plasma treatment may be applied on the surface thereof, or an anchor-coating agent such as polyurethane, polyisocyanate, organic titanate, polyethyleneimine, or polybutadiene may be coated thereon, if necessary.

As it is possible to form a conductive film by a common printing or application method by use of the conductive ink or the conductive resin composition according to the present invention, products with a conductive film or layer can be produced using existing facilities. Specifically, as it is possible to print and form a conductive film or a circuit after common printing for heightening the design such as printing of pictures and others, the method is far more favorable in productivity, initial investment cost, and running cost than conventional methods such as etching and transferring methods.

Further, an anchor-coating agent or a varnish may be applied on the base material in the step before preparation of the conductive film for increase of the adhesiveness between the conductive film and the base material. Furthermore, after formation of the conductive film, an over-print varnish or any other coating agent may be applied thereon for protection of the conductive film. These various varnishes and coating agents are preferably ones that are cured by active energy rays from the viewpoint of environmental friendliness.

It is also possible to prepare electromagnetic shield films and non-contact media by laminating on the conductive film a base paper material or a plastic film where pictures or the like are printed, by applying an adhesive on the conductive film and bonding each other or by melting extrusion or the like. Of course, it is possible to use an adhesive or a base material previously coated with an adhesive, and also to make the conductive film tacky.

For reduction of the resistivity of conductive film or for improvement in resistivity stability, the conductive film which was formed by the aforementioned printing or coating method and then normally dried or cured by active energy ray may be heated in a hot air drying oven. The heating temperature is not particularly limited, but is preferably a temperature suitable for the base material and the printing speed used. The heating may be performed using heat rolls or heat press rolls. It is preferred to heat by heat rolls or heat press rolls because the stability resistance of the conductive film is heightened and it leads to stabilization of radio wave communication when the material is used as an antenna circuit of non-contact medium.

EXAMPLES

Hereinafter, the present invention will be described more in detail with reference to Examples, but it should be understood that the present invention is not limited thereto. In Examples, "part" and "%" respectively mean "part by weight" and "% by weight". The concentrations of silver and gold were determined by using a thermal analyzer, TG-DTA made by Hitachi Ltd.

Example 1

91.1 parts of toluene and 3.2 parts of a pigment dispersant, Solsperse 32000 manufactured by Lubrizol Japan Corporation were charged into a separable four-necked flask equipped with a condenser tube, a thermometer, a nitrogen gas inlet tube and a stirrer under nitrogen gas and dissolved. Then, 73.1 parts of 20% aqueous succinic dihydrazide solution (2 mole times of hydrazide as much as that of metal) was added dropwise thereto at 50° C. while being stirred, to generate uniform droplets. 100 parts of 1 M aqueous silver nitrate solution was weighed and charged into a beaker, and then 27.3 parts of 25% aqueous ammonia (4 mole times as much as that of metal) was added dropwise thereto while being stirred. The aqueous ammonia complex solution obtained was added dropwise into the toluene solution above and allowed reaction at 30° C. After leaving the mixture and separating it into toluene phase and water phase, the aqueous phase was taken away to remove the excessive reducing agent and impurities. Washing of the residual toluene phase with distilled water and separation of distilled water phase were subsequently conducted several times for removing the reducing agent and impurities remaining in the toluene phase, to give a dispersion of fine silver particles in toluene. The dispersion of fine silver particles obtained was flowable and had a strong absorption at the wavelength of 417 nm and had a silver concentration of 78%. The average particle diameter of the fine silver particles was 7±2 nm and the particle diameter thereof was uniform. The yield of the fine silver particle dispersion was 89%, and the absorption wavelength of the dispersion and the particle diameter of the fine silver particle were not changed even after storage at 40° C. for one month.

Example 2

A dispersion of fine silver particles was prepared in the same manner as Example 1 except that the amount of the pigment dispersant was changed to 0.5 parts. The dispersion of fine silver particle obtained was flowable and had broad wavelength range absorption at 429 nm and had a silver concentration of 50%. The average particle diameter of the fine silver particles was 15±10 nm and the distribution of the silver particle was wide. The yield of the fine silver particle dispersion was 40%, and the average particle diameter of the fine silver particles became 50 nm after storage at 40° C. for one month.

Example 3

A dispersion of fine silver particle was prepared in the same manner as Example 1 except that the amount of the 25% aqueous ammonia was changed to 40.9 parts (6 moles times as much as that of metal). The dispersion of fine silver particles obtained was flowable, and had a strong absorption at the wavelength of 416 nm and a silver concentration of 76%. The average particle diameter of the fine silver particles was 5±2 nm and the particle diameter of the fine silver particles was uniform. The yield of the fine silver particle dispersion was 85%, and the absorption wavelength of the fine silver particle dispersion and particle diameter of the fine silver particle were not changed even after storage at 40° C. for a month.

Example 4

A dispersion of fine silver particles was prepared in the same manner as Example 1 except that the amount of the 20% aqueous succinic dihydrazide solution was changed to 36.6 parts (1 mole times of hydrazide group as much as 1 mol of metal). The dispersion of fine silver particles obtained was flowable and had a strong absorption at the wavelength of 420 nm and a silver concentration of 80%. The average particle diameter of the fine silver particles was 8±3 nm and the distribution of the silver particles was narrow. The yield of the fine silver particle dispersion was 90%, and the absorption wavelength of the fine silver particle dispersion and particle diameter of the fine silver particle were not changed even after storage even after storage at 40° C. for a month.

Example 5

A dispersion of fine silver particles was prepared in the same manner as Example 1 except that the reducing agent was replaced with 174.2 parts of 10% adipic dihydrazide (2 mole times of hydrazide as much as that of metal). The dispersion of fine silver particles obtained was flowable and had slightly broad wavelength absorption at 424 nm and a silver concentration of 75%. The average particle diameter of the fine silver particles was 10±5 nm. The yield of the fine silver particle dispersion was 80%, and the absorption wavelength of the fine silver particle dispersion and particle diameter of the fine silver particle were not changed even after storage at 40° C. for a month.

Example 6

5.9 parts of a pigment dispersant, Solsperse 32000 manufactured by Lubrizol Japan Ltd. and 91.1 parts of toluene were charged and dissolved in a separable four-necked flask equipped with a condenser tube, a thermometer, a nitrogen gas inlet tube and a stirrer under nitrogen gas; and 73.1 parts of 20% aqueous succinic dihydrazide solution (2 mole times of hydrazide as much as that of metal) was added dropwise at 50° C., while being stirred, to generate uniform droplets. 100 parts of 1 M aqueous aurichloric acid solution was weighed and charged into a beaker; 27.3 parts of 25% aqueous ammonia (4 mole times as much as that of metal) was added dropwise thereto, while being stirred; and the aqueous ammonia complex solution obtained was added dropwise into the toluene solution above, allowing reaction at 30° C. After leaving the mixture and separating toluene phase and water phase, the aqueous phase was taken away to remove the excessive reducing agent and impurities. Washing of the residual toluene phase with distilled water and separation of distilled water phase were subsequently conducted several times for removing the reducing agent and impurities remaining in the toluene phase, to give a dispersion of fine gold particles in toluene. The fine gold particle dispersion obtained was flowable and had a strong absorption at the wavelength of 531 nm and a gold concentration of 70%, and the average particle diameter of the fine gold particles was at 5±2 nm and the particle diameter thereof was uniform. The yield of the fine gold particle dispersion was 83%, and the absorption and the particle diameter thereof were stable even after storage at 40° C. for a month.

Example 7

91.1 parts of toluene and 3.2 parts of a pigment dispersant, Solsperse 32000 manufactured by Lubrizol Japan Ltd. were charged and dissolved in a separable four-necked flask equipped with a condenser tube, a thermometer, a nitrogen gas inlet tube and a stirrer under nitrogen gas, and 73.1 parts of 20% aqueous succinic dihydrazide solution (2 mole times of hydrazide as much as that of metal) was added thereto at 50° C., while being stirred, to generate uniform droplets. 100 parts of 1 M aqueous silver nitrate solution was added dropwise into the toluene solution and allowed reaction at 30° C. After leaving the mixture and separating it into toluene phase and water phase, the aqueous phase was taken away to remove the excessive reducing agent and impurities. Washing of the residual toluene phase with distilled water and separation of distilled water phase were subsequently conducted several times for removing the reducing agent and impurities remaining in the toluene phase, to give a dispersion of fine silver particles in toluene. The fine silver particle dispersion obtained was flowable and had a slightly broad absorption at the wavelength of 430 nm, a silver concentration of 45%, and the average particle diameter of the fine silver particles was 20±5 nm. However as there occurred aggregation precipitation, the yield of the fine silver particle dispersion was 40%. The fine silver particle dispersion had some precipitates after storage at 40° C. for one month.

Comparative Example 1

91.1 parts of toluene and 3.2 parts of a pigment dispersant, Solsperse 32000 manufactured by Lubrizol Japan Ltd. were charged into a separable four-necked flask equipped with a condenser tube, a thermometer, a nitrogen gas inlet tube and a stirrer under nitrogen gas and dissolved. Then, 3.8 parts of sodium borohydride was added dropwise thereto at 50° C. while being stirred, to generate uniform droplets. After 100 parts of 1 M aqueous aurichloric acid solution was weighed and charged into a beaker, 27.3 parts of 25% aqueous ammonia was added dropwise thereto while being stirred and the aqueous ammonia complex solution obtained was added dropwise into the toluene solution above and allowed reaction at 30° C. After leaving the mixture and separating it into toluene phase and water phase, the aqueous phase was taken away to remove the excessive reducing agent and impurities. Washing of the residual toluene phase with distilled water and separation of distilled water phase were subsequently conducted several times for removing the reducing agent and impurities remaining in the toluene phase, to give a dispersion of fine silver particles in toluene. The fine silver particle dispersion obtained was flowable and had a broad absorption at the wavelength of 432 nm and a silver concentration of 39%. The average particle diameter of the fine silver particles was 25±10 nm and the particle diameter distribution thereof was wide. The yield of the fine silver particle dispersion was 30% as there occurred aggregation precipitation. After storage at 40° C. for one month, the dispersion aggregated and precipitated.

Example 8

5.4 parts of the fine silver particle dispersion obtained in Example 1, 80.8 parts of a flaky metal powder, AgC-A manufactured by Fukuda Metal Foil and Powder Co., Ltd. with an average particle diameter of 3.7 μm, a tap density of 3.1 g/cm$^3$, and a specific surface area of 0.8 m$^2$/g, 13.8 parts of a polyester resin, Elitel UE-3223 manufactured by Unitika Ltd., and 33.3 parts of a liquid medium, isophorone were mixed and stirred in a planetary mixer for 30 minutes, to give a conductive ink. Then, the conductive ink was printed on a polyester film, Ester E5100 manufactured by Toyobo Co., Ltd., with 50 μm in thickness by use of a rotary screen printing machine manufactured by Stork Prints Japan KK, having a 405 mesh plate and dried to form a conductive circuit pattern having a width of 3 mm. The surveyed drying temperature of the printing machine was adjusted to 80° C.

Example 9

7.5 parts of the fine silver particle dispersion obtained in Example 2, 71.3 parts of a spherical metal powder, C-0083P manufactured by METALOR with an average particle diameter of 1.3 μm, a tap density of 2.5 g/cm$^3$, and a specific surface area of 1.7 m$^2$/g, 21.3 parts of a polyester resin, Elitel UE-3223 manufactured by Unitika Ltd., and 42.9 parts of a liquid medium, isophorone were mixed in a planetary mixer for 30 minutes, to give a conductive ink. Then, a conductive circuit pattern was formed by rotary screen-printing with the conductive ink and drying it in the same manner as Example 8.

Example 10

3.6 parts of the fine silver particle dispersion obtained in Example 3, 87.3 parts of a flaky silver powder, AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, 9.1 parts of a polyurethane resin, POLYURETHANE 75 manufactured by ARAKAWA CHEMICAL INDUSTRIES LTD. and 53.8 parts of liquid medium (isopropyl alcohol/ethyl acetate: 8/2, weight ratio) were mixed and stirred in a dissolver for 30 minutes, to give a conductive ink. Then, the conductive ink was printed on a polyester film, Ester E5100 manufactured by Toyobo Co., Ltd. with 50 μm in thickness by flexographic printing using a CI-type flexographic printing machine, SOLOFLEX manufactured by W&H with anilox of 120 lines/inch and drying it to form a conductive circuit pattern having a width 3 of mm. The surveyed drying temperature of the printing machine was adjusted to 50° C.

Example 11

10.6 parts of the fine silver particle dispersion obtained in Example 4, 53.6 parts of a flaky silver powder, AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, 22.9 parts of a spherical metal powder, C-0083P manufactured by METALOR with an average particle diameter of 1.3 μm, a tap density of 2.5 g/cm$^3$, and a specific surface area of 1.7 m$^2$/g, 20.0 parts of a polyurethane resin, POLYURETHANE 75 manufactured by ARAKAWA CHEMICAL INDUSTRIES LTD., and 46.7 parts of a liquid medium (isopropyl alcohol/ethyl acetate: 8/2, weight ratio) were mixed and stirred in a Dissolver for 30 minutes, to give a conductive ink. Then, a conductive circuit pattern was formed by flexographic printing with the conductive ink and drying it in the same manner as Example 10.

Example 12

3.2 parts of the fine silver particle dispersion obtained in Example 5, 77.6 parts of a flaky metal powder AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, 19.2 parts of a polyester acrylate, Ebecryl 80 manufactured by Daicel-UCB Co. Ltd., 2 parts of a photopolymerization initiator, Irgacure 907 manufactured by Ciba Specialty Chemicals were mixed and stirred in a dissolver for 30 minutes, to give a conductive ink. Then, the conductive ink was printed on a polyester film, Ester E5100 manufactured by Toyobo Co., Ltd. with 50 μm in thickness by flexographic printing using a CI-type flexographic printing machine, SOLOFLEX manufactured by W&H with anilox of 120 lines/inch and irradiating it with UV light to form a conductive circuit pattern having a width 3 of mm.

Example 13

6.1 parts of the fine gold particle dispersion obtained in Example 6, 80.8 parts of a a flaky metal powder AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, 13.2 parts of a polyester resin, Elitel UE-3223 manufactured by Unitika Ltd., and 42.9 parts of a liquid medium, isophorone were mixed in a planetary mixer for 30 minutes, to give a conductive ink. Then, a conductive circuit pattern was formed by rotary screen-printing and drying the conductive ink in the same manner as Example 8.

Example 14

10.9 parts of the fine silver particle dispersion obtained in Example 7, 80.8 parts of a flaky silver powder, AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, and 8.4 parts of a polyester resin, Elitel UE-3223 manufactured by Unitika Ltd., and 33.3 parts of a liquid medium, isophorone were mixed in a planetary mixer for 30 minutes, to give a conductive ink. Then, a conductive circuit pattern was formed by rotary screen-printing and drying the conductive ink in the same manner as Example 8.

Comparative Example 2

6.9 parts of the fine silver particle dispersion obtained in Comparative Example 1, 87.3 parts of a flaky silver powder, AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, 7.7 parts of a polyurethane resin, POLYURETHANE 75 manufactured by ARAKAWA CHEMICAL INDUSTRIES LTD., and 51.9 parts of a liquid medium (isopropyl alcohol/ethyl acetate:8/2, weight ratio) were mixed and stirred in a Dissolver for 30 minutes, to give a conductive ink.

Then, a conductive circuit pattern was formed by flexographic printing and drying the conductive ink in the same manner as Example 10.

Example 15

200 parts of toluene and 38.9 parts of silver oleate were charged into a separable four-necked flask equipped with a condenser tube, a thermometer, a nitrogen gas inlet tube and a stirrer at room temperature under nitrogen environment while being stirred, to give a 0.5 M solution and 2.3 parts of a dispersant, diethylaminoethanol (DEAE) (0.2 mole times as much as that of metal) was charged into the solution and dissolved. Then, 73.1 parts of 20% aqueous solution of succinic dihydrazide (hereinafter, abbreviated as SUDH) (2 mole times of hydrazide group as much as that of metal) was dropwise added thereto. The color of the liquid was changed from pale yellow to dark brown. The mixture was heated to 40° C. for accelerating the reaction. After leaving the mixture and separating it into toluene phase and water phase, the aqueous phase was taken away to remove the excessive reducing agent and impurities. Washing of the residual toluene phase with distilled water and separation of distilled water phase were subsequently conducted several times for removing the reducing agent and impurities remaining in the toluene phase, to give a dispersion of fine silver particles in toluene. The average particle diameter of the fine silver particles in the fine silver particle dispersion obtained was 7±2 nm and the silver concentration was 73%. The particle diameter did not change even after storage for one month at 40° C. and the dispersion was stable.

Example 16

200 parts of toluene and 18.1 parts of silver propionate were charged in a separable four-necked flask equipped with a condenser tube, a thermometer, a nitrogen gas inlet tube and a stirrer at room temperature under nitrogen environment while being stirred, to give a 0.5 M solution and 2.3 parts (0.2 mole times as much as that of metal) of a dispersant, diethylaminoethanol and 2.8 parts of oleic acid (0.1 mole times as much as that of metal) were added and dissolved therein. Then, 73.1 parts of 20% aqueous SUDH solution (2 mole times as much as that of metal) was dropwise added thereto. The color of the liquid was changed from pale yellow to dark brown. The mixture was heated to 40° C. for accelerating the reaction. After leaving the mixture and separating it into toluene phase and water phase, the aqueous phase was taken away to remove the excessive reducing agent and impurities. Washing of the residual toluene phase with distilled water and then separating distilled water phase were subsequently conducted several times for removing the reducing agent and impurities remaining in the toluene phase, to give a dispersion of fine silver particles in toluene. The average particle diameter of the fine silver particles in the fine silver particle dispersion obtained was 5±2 nm and the silver concentration was 75%. The particle diameter did not change even after storage at 40° C. for a month and the dispersion was stable.

Example 17

A dispersion of fine silver particles was prepared in the same manner as Example 16 except that the raw metal salt was changed to 20.9 parts of silver pentanoate. The average particle diameter of the fine silver particles in the fine silver particle dispersion obtained was 5±1 nm and the silver concentration was 82%. The particle diameter did not change even after storage for one month at 40° C. and the dispersion was stable.

Example 18

A dispersion of fine silver particles was prepared in the same manner as Example 16 except that the raw metal salt was changed to 22.3 parts of silver hexanoate. The average particle diameter of the fine silver particles in the fine silver particle dispersion obtained was 5±2 nm and the silver concentration was 80%. The particle diameter did not change even after storage for one month at 40° C. and the silver particle dispersion was stable.

Example 19

A dispersion of fine silver particles was prepared in the same manner as Example 17 except that the reducing agent solution was changed to 174.2 parts (2 mole times as much as that of metal) of 20% aqueous adipic dihydrazide (ADH) solution. The average particle diameter of the fine silver particles in the fine silver particle dispersion obtained was 6±2 nm and the silver concentration was 75%. The particle diameter did not change even after storage for one month at 40° C. and the silver particle dispersion was stable.

Example 20

A dispersion of fine silver particles was prepared in the same manner as Example 16 except that the raw metal salt was changed to 33.5 parts of silver myristate. The average particle diameter of the fine silver particles in the fine silver particle dispersion obtained was 8±2 nm and the silver concentration was 72%. The particle diameter did not change even after storage for one month at 40° C. and the silver particle dispersion was stable.

Example 21

A dispersion of fine silver particles was prepared in the same manner as Example 16 except that the raw metal salt was changed to 39.1 parts of silver stearate. The average particle diameter of the fine silver particles in the fine silver particle dispersion obtained was 8±2 nm and the silver concentration was 65%. The particle diameter did not change even after storage for one month at 40° C. and the silver particle dispersion was stable.

Example 22

A fine red copper particle dispersion was prepared in the same manner as Example 16 except that the raw metal salt was changed to 26.6 parts of copper pentanoate and the reducing agent solution to 292.3 parts of 20% aqueous SUDH solution (4 mole times as much as 1 mol of metal). The average particle diameter of the copper fine particles in the copper fine particle dispersion obtained was 7±2 nm and the copper concentration was 50%. The average particle diameter changed to 10±2 nm after storage at 40° C. for one month, but the dispersion was stable without any aggregation.

Example 23

A fine red purple gold particle dispersion was prepared in the same manner as Example 16 except that the raw metal salt was changed to 29.8 parts of gold pentanoate. The average particle diameter of the fine gold particles in the fine gold particle dispersion obtained was 10±3 nm and the gold concentration was 55%. The particle diameter did not change even after storage for one month at 40° C. and the dispersion was stable.

Comparative Example 3

100 parts of 1 M aqueous silver nitrate solution was charged into a separable four-necked flask equipped with a condenser tube, a thermometer, a nitrogen gas inlet tube and a stirrer under nitrogen gas and then a solution of 1.9 parts of Solsperse 32000 manufactured by Avecia KK with weight-average molecular weight of approximately 50,000 in 10.8 parts of toluene was dropwise added thereto while being stirred. The mixture was stirred at room temperature for 30 minute, and then, 38.1 parts of dimethylaminoethanol was dropwise added thereto. The resultant mixture was stirred overnight at room temperature for progress of the reaction. After leaving the mixture and separating it into toluene phase and water phase, the aqueous phase was taken away to remove the excessive reducing agent and impurities. Washing of the residual toluene phase with distilled water and then separating distilled water phase were conducted several times for removing the reducing agent and impurities remaining in the toluene phase, to give a dispersion of fine silver particles in toluene. The fine silver particle dispersion obtained was a paste-like dispersion. The average particle diameter of the fine silver particles therein as determined after dilution was 25±10 nm and the silver concentration was 50%. The particle diameter changed to 50 nm after storage at 40° C. for one month.

Comparative Example 4

200 parts toluene and 22.3 parts of silver hexanoate were charged into a separable four-necked flask equipped with a condenser tube, a thermometer, a nitrogen gas inlet tube and a stirrer under nitrogen environment at room temperature while being stirred, to give a 0.5 M solution, and then 2.3 parts (0.2 mole times as much as that of metal) of a dispersant, diethylaminoethanol and 2.8 parts (0.1 mole times as much as that of metal) of oleic acid were charged thereinto and dissolved. When there was added subsequently 3.2 parts (2 mole times as much as that of metal) of hydrazine, vigorous reaction was occurred and precipitates were formed. After leaving the mixture and separating it into toluene phase and water phase, the aqueous phase was taken away to remove the precipitates, the excessive reducing agent and impurities. Washing of the residual toluene phase with distilled water and then separating distilled water phase were subsequently conducted several times for removing the reducing agent and impurities remaining in the toluene phase, to give a dispersion of fine silver particles in toluene. The average particle diameter of the fine silver particles therein was 20±5 nm and the silver concentration was 30%. Precipitates were formed in the dispersion after storage at 40° C. for one month.

Example 24

Toluene in the fine silver particle dispersion obtained in Example 17 was evaporated in a rotary evaporator to form a concentrated dispersion having 50% solid content. 71.0 parts of the dispersion, 26.0 parts of methyl ethyl ketone, and 3.0 parts of a polyester resin, Byron 300 manufactured by Toyobo Co., Ltd. were mixed and stirred in a Dissolver for 30 minutes, to give a conductive ink.

Example 25

Each of the fine metal particle dispersions obtained in Examples 15 to 23 and Comparative Examples 3 to 4 and the conductive ink obtained in Example 24 was coated on a PET base plate by spin coating, and the film was dried in a hot air drying oven at 150° C. for one hour, to give a conductive film.

Example 26

Each of the fine metal particle dispersions obtained in Examples 15 to 23 and Comparative Examples 3 to 4 and the conductive ink obtained in Example 24 was coated on a glass plate by spin coating, and the resultant film was dried in a hot air drying oven at 180° C. for one hour, to give a conductive film.

Example 27

91.1 parts of toluene, 3.8 parts of a pigment dispersant, Solsperse 32000 manufactured by Avecia Ltd., 3.0 parts (5 wt % with respect to the metal) of a discoloration inhibitor and octyl mercaptopropionate manufactured by Yodo Kagaku Co., Ltd. were charged into a separable four-necked flask equipped with a condenser tube, a thermometer, a nitrogen gas inlet tube and a stirrer and dissolved. Then 73.1 parts (2 mole times of hydrazide as much as that of metal) of 20% aqueous succinic dihydrazide solution was dropwise added thereto at 50° C. while being stirred, to generate uniform droplets. 100 parts of 1 M aqueous silver nitrate solution was weighed and charged into a beaker and 27.3 parts (4 mole times as much as that of metal) of 25% aqueous ammonia was dropwise added thereto while being stirred and the aqueous ammonia complex solution obtained was added dropwise into the toluene solution at 30° C. for progress of the reaction. After leaving the mixture and separating it into toluene phase and water phase, the aqueous phase was taken away to remove the precipitates, the excessive reducing agent and impurities. Washing of the residual toluene phase with distilled water and then separating distilled water phase were subsequently conducted several times for removing the reducing agent and impurities remaining in the toluene phase, to give a dispersion of fine silver particles in toluene. The fine silver particle dispersion obtained was flowable and uniform dispersion having a strong absorption at the wavelength of 417 nm and a silver concentration of 70%. The average particle diameter of the fine silver particles therein was 5 nm.

Example 28

A dispersion was prepared in the same manner as Example 27 except for using 3.0 parts of di-n-hexylsulfide, SFI-6, manufactured by Daihachi Chemical Industry Co., Ltd. instead of the discoloration inhibitor, octyl mercaptopropionate. The fine silver particle dispersion obtained was a flowable and uniform dispersion having a strong absorption at the wavelength of 420 nm and a silver concentration of 73%. The average particle diameter of the fine silver particles therein was 7 nm.

Example 29

200 parts of toluene and 20.9 parts of silver pentanoate were charged into a separable four-necked flask equipped with a condenser tube, a thermometer, a nitrogen gas inlet tube and a stirrer under nitrogen environment while being stirred at room temperature, to give a 0.5 M solution. Then, 2.3 parts (0.2 mole times as much as that of metal) of a dispersant, diethylaminoethanol, 2.8 parts (0.1 mole times as much as that of metal) of oleic acid, and 0.8 part (5 wt % with respect to the metal) of a sulfidization inhibitor, di-n-hexylsulfide (SFI-6, manufactured by Daihachi Chemical Industry Co., Ltd.) were added to the solution and dissolved. Subsequent dropwise addition of 73.1 parts of 20% aqueous SUDH solution (2 mole times as much as that of metal) caused discoloration of the liquid from pale yellow to dark brown. The mixture was heated to 40° C. for acceleration of the reaction. After leaving the mixture and separating it into toluene phase and water phase, the aqueous phase was taken away to remove the precipitates, the excessive reducing agent and impurities. Washing of the residual toluene phase with distilled water and then separating distilled water phase were subsequently conducted several times for removing the reducing agent and impurities remaining in the toluene phase, to give a dispersion of fine silver particles in toluene. The average particle diameter of the fine silver particles in the fine silver particle dispersion obtained was 5±2 nm and the silver concentration was 80%. The particle diameter did not change even after storage for one month at 40° C. and the dispersion was stable.

Comparative Example 5

91.1 parts of toluene and 3.8 parts of a pigment dispersant, Solsperse 32000 manufactured by Avecia Ltd. were charged into a separable four-necked flask equipped with a condenser tube, a thermometer, a nitrogen gas inlet tube and a stirrer and dissolved. Then, 54.3 parts of 35% aqueous dimethylaminoethanol solution was dropwise added thereto while being stirred at room temperature, to generate uniform droplets. 100 parts of 1 M aqueous silver nitrate solution was dropwise added thereto, and the resultant mixture was heated to 50° C. for progress of the reaction. The excessive reducing agent and impurities were removed by taking away the aqueous phase; and washing of the residual toluene phase with distilled water and then separating distilled water phase were conducted several times for removing the reducing agent and impurities remaining in the toluene phase, to give a dispersion of fine silver particles in toluene. The dispersion obtained was flowable and uniform dispersion having a strong absorption at the wavelength of 417 nm and a silver concentration of 70%. The average particle diameter of the fine silver particles therein was 7 nm.

Example 30

5.4 parts of the fine silver particle dispersion obtained in Example 27, 80.8 parts of a flaky silver powder, AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, 13.8 parts of a polyester resin, Elitel UE-3223 manufactured by Unitika Ltd., and 33.3 parts of liquid medium, isophorone were mixed in a planetary mixer for 30 minutes, to give a conductive ink. Then, the conductive ink was printed on a polyester film, Ester E5100 manufactured by Toyobo Co., Ltd., with 100 μm in thickness by use of a rotary screen printing machine manufactured by Stork Prints Japan KK, having a 405 mesh plate and dried to form a conductive circuit pattern having a width of 3 mm. The surveyed drying temperature of the printing machine was set to 80° C.

Example 31

5.2 parts of the fine silver particle dispersion obtained in Example 28, 80.8 parts of a flaky silver powder, AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, 13.8 parts of a polyester resin, Elitel UE-3223 manufactured by Unitika Ltd., and 33.3 parts of a liquid medium, isophorone were mixed in a planetary mixer for 30 minutes, to give a conductive ink. Then, the conductive ink was printed on a polyester film, Ester E5100 manufactured by Toyobo Co., Ltd., with 100 μm in thickness by use of a rotary screen printing machine manufactured by Stork Prints Japan KK, having a 405 mesh plate and dried to form a conductive circuit pattern having a width of 3 mm. The surveyed drying temperature of the printing machine was set to 80° C.

Example 32

The fine silver particle dispersion obtained in Example 29 was coated on a PET base plate by spin coating and the film was dried at 150° C. for 1 hour in a hot air drying oven, to give a conductive film.

Comparative Example 6

0.19 parts of octyl mercaptopropionate was added to 5.4 parts of the fine silver particle dispersion obtained in Comparative Example 5 and then, 80.8 parts of a flaky silver powder, AgC-A manufactured by Fukuda Metal Foil and Powder Co., Ltd. with an average circle-equivalent diameter of 3.7 μm, a tap density of 3.1 g/cm$^3$, and a specific surface area of 0.8 m$^2$/g, 13.8 parts of a polyester resin, Elitel UE-3223 manufactured by Unitika Ltd., and 33.3 parts of a liquid medium, isophorone were mixed in a planetary mixer for 30 minutes, to give a conductive ink. Then, the conductive ink was printed on a polyester film, Ester E5100 manufactured by Toyobo Co., Ltd., with 100 μm in thickness by use of a rotary screen printing machine manufactured by Stork Prints Japan KK, having a 405 mesh plate and dried to form a conductive circuit pattern having a width of 3 mm. The surveyed drying temperature of the printing machine was set to 80° C.

Comparative Example 7

5.4 parts of the fine silver particle dispersion obtained in Comparative Example 5, 80.8 parts of a flaky metal powder, AgC-A manufactured by Fukuda Metal Foil and Powder Co., Ltd., with average particle diameter of 3.7 μm, a tap density of 3.1 g/cm$^3$, a specific surface area of 0.8 m$^2$/g), 13.8 parts of a polyester resin, Elitel UE-3223 manufactured by Unitika Ltd., and 33.3 parts of a liquid medium, isophorone were mixed in a planetary mixer for 30 minutes, to give a conductive ink. Then, the conductive ink was printed on a polyester film, Ester E5100 manufactured by Toyobo Co., Ltd., with 100 μm in thickness by use of a rotary screen printing machine manufactured by Stork Prints Japan KK, having a 405 mesh plate and dried to form a conductive circuit pattern having a width of 3 mm. The surveyed drying temperature of the printing machine was set to 80° C.

The fluidity of each of the conductive inks obtained in Examples 8 to 14 and Comparative Example 2 and the volume resistivity, base-material adhesiveness, and IC-tag communication distance of the conductive film are evaluated by the following methods. The results are summarized in Table 1.

The film thickness and the volume resistivity of the conductive films formed by coating the fine metal particle dispersions obtained by the methods of Examples 15 to 23 and Comparative Examples 3 to 4 and the conductive ink obtained in Example 24 by the method for Example 25 or 26 were evaluated by the following methods. The results are summarized in Table 2.

The volume resistivity, discoloration resistance, and resistivity stability after discoloration of the conductive films obtained in Examples 30 to 32 and Comparative Examples 6 to 7 were determined by the following methods. The results are summarized in Table 3.

[Ink Fluidity]

A predetermined amount of conductive ink was weighted and added in a container, and the viscosity of the ink therein was determined at 6 rotations and 60 rotations in an environment at 25° C. by a type-B viscometer. Then, the thixotropic index (TI), (viscosity at the 6th rotation)÷(viscosity at the 60th rotation), was calculated. The results were evaluated according to the following criteria:
 ○: Favorably flowable, TI<2.0
 Δ: Fairly flowable, 2.0≦TI≦8.0
 x: Less flowable, TI>8.0

[Volume Resistivity]

Four positions of conductive circuit were pinched at an interval of 30 mm, and the resistance thereof was determined using a four-probe resistance meter, R-1000CU manufactured by Sanwa Electric Instrument Co., Ltd. The film thickness of a conductive circuit was determined using a thickness meter MH-15M manufactured by Sendai Nikon Corporation, and the volume resistivity was calculated from the resistivity and the film thickness obtained. In the case of a conductive film, the film was cut into strips having a width of 3 mm, and then, the volume resistivity was determined similarly.

[Adhesiveness of Base Material]

A cellophane adhesive tape manufactured by Nichiban Co., Ltd. with 12 mm in width was put on a conductive circuit formed by printing a conductive ink on a polyester film, E5100 manufactured by Toyobo Co., Ltd. with 50 μm in thickness and then peeled off rapidly. The area of the conductive circuit peered off was evaluated according to the following criteria:
 ○: Rarely peeled off (peel-off area: less than 10%)
 Δ: Partially peeled off (peel-off area: 10% or more and less than 50%)
 x: Almost peeled off (peel-off area: 50% or more)

[IC Tag Communication Test]

An IC tag was prepared by mounting IC chips on a conductive circuit by use of an IC strap manufactured by Alien Technology, and the communicative distance (cm) of the IC tag obtained was determined by use of the 2.45-GHz passive development kit manufactured by the same maker as above.

[Film Thickness]

The film thickness of a conductive film was determined using a film thickness meter, MH-15M manufactured by Sendai Nikon Corporation.

[Discoloration Resistance Test]

A conductive ink coating film was left in an environment containing $H_2S$ at a concentration of 3 ppm at a temperature of 40° C. and a relative humidity of 90% RH for 5 hours. The degree of discoloration was observed by eyes and evaluated according to the following criteria:
 ○: Almost no discoloration
 Δ: Some discoloration
 x: Remarkable discoloration

[Resistivity Stability after Discoloration]

Change in resistance of the conductive ink coating film before and after the discoloration resistance test was determined and stability thereof was evaluated according to the following criteria:
 ○: Change in volume resistivity is less than 20%.
 Δ: Change in volume resistivity is 20% or more and less than 30%.
 x: Change in volume resistivity is 30% or more.

TABLE 1

| | Raw materials | Kind and characteristic values | Example 8 | Example 9 | Example 10 | Example 11 |
|---|---|---|---|---|---|---|
| Composition (part) | Fine metal particle dispersion | Kind | (Example 1) | (Example 2) | (Example 3) | (Example 4) |
| | | Amount (part) | 5.4 | 7.5 | 3.6 | 10.6 |
| | Metal powder | Flaky silver powder, average particle diameter: 3.7 μm | 80.8 | | 87.3 | 53.6 |
| | | Spherical metal powder, average particle diameter: 1.3 μm | | 71.3 | | 22.9 |
| | Resin | polyurethane resin | | | 9.1 | 20.0 |
| | | polyester resin | 13.8 | 21.3 | | |
| | Resin precursor | polyester acrylate | | | | |
| | Liquid medium | | 33.3 | 42.9 | 53.8 | 46.7 |
| | Photopolymerization initiator | "Irgacure 907" | | | | |

| | Item | Condition | Example 8 | Example 9 | Example 10 | Example 11 |
|---|---|---|---|---|---|---|
| Evaluation results | [Drying method] | | Heat | Heat | Heat | Heat |
| | [Printing method] | | Rotary screen | Rotary screen | Flexographic | Flexographic |
| | [Drying condition] | Temperature/period, or UV irradiation amount | 80° C./5 sec. | 80° C./5 sec. | 50° C./5 sec. | 50° C./5 sec. |
| | Ink fluidity | TI at 25° C. | ○ | Δ | ○ | ○ |
| | Volume resistivity | Measurement by four-probe method (Ω · cm) | $1.9 \times 10^{-5}$ | $4.3 \times 10^{-5}$ | $2.2 \times 10^{-5}$ | $1.6 \times 10^{-5}$ |
| | Base material adhesiveness | Adhesiveness evaluation with cellophane adhesive tape | ○ | ○ | ○ | ○ |
| | IC tag communication test | 2.45-GHz tag communication distance (cm) | 45 | 35 | 45 | 45 |

TABLE 1-continued

| | Raw materials | Kind and characteristic values | Example 12 | Example 13 | Example 14 | Comparative Example 2 |
|---|---|---|---|---|---|---|
| Composition (part) | Fine metal particle dispersion | Kind | (Example 5) | (Example 6) | (Example 7) | (Comparative Example 1) |
| | | Amount (part) | 3.2 | 6.1 | 10.9 | 6.9 |
| | Metal powder | Flaky silver powder, average particle diameter: 3.7 μm | 77.6 | 80.8 | 80.8 | 87.3 |
| | | Spherical metal powder, average particle diameter: 1.3 μm | | | | |
| | Resin | polyurethane resin | | | | 7.7 |
| | | polyester resin | | 13.2 | 8.4 | |
| | Resin precursor | polyester acrylate | 19.2 | | | |
| | Liquid medium | | | 42.9 | 33.3 | 51.9 |
| | Photopolymerization initiator | "Irgacure 907" | 2 | | | |

| | Item | Condition | Example 12 | Example 13 | Example 14 | Comparative Example 2 |
|---|---|---|---|---|---|---|
| Evaluation results | [Drying method] | | UV | Heat | Heat | Heat |
| | [Printing method] | | Flexo-graphic | Rotary screen | Rotary screen | Flexo-graphic |
| | [Drying condition] | Temperature/period, or UV irradiation amount | 300 mJ/cm$^2$ | 80° C./5 sec. | 80° C./5 sec. | 50° C./5 sec. |
| | Ink fluidity | TI at 25° C. | ○ | ○ | Δ | Δ |
| | Volume resistivity | Measurement by four-probe method (Ω·cm) | $3.8 \times 10^{-5}$ | $4.6 \times 10^{-5}$ | $6.7 \times 10^{-5}$ | $3.3 \times 10^{-3}$ |
| | Base material adhesiveness | Adhesiveness evaluation with cellophane adhesive tape | ○ | ○ | ○ | X |
| | IC tag communication test | 2.45-GHz tag communication distance (cm) | 40 | 35 | 20 | <5 |

TABLE 2

| | | | Example 15 | Example 16 | Example 17 | Example 18 | Example 19 | Example 20 |
|---|---|---|---|---|---|---|---|---|
| Organic acid metal salt | | | Ag oleate | Ag propionate | Ag pentanoate | Ag hexanoate | Ag pentanoate | Ag myristate |
| Dispersant | | | DEAE | DEAE oleic acid | DEAE oleic acid | DEAE oleic acid | DEAE oleic acid | DEAE oleic acid |
| Reducing agent | | | SUDH | SUDH | SUDH | SUDH | ADH | SUDH |
| Example 25 | PET 150° C. 1 hr | Film thickness (μm) | 0.50 | 0.47 | 0.48 | 0.45 | 0.42 | 0.45 |
| | | Resistance [Ω·cm] | $1.2 \times 10^{-5}$ | $7.5 \times 10^{-6}$ | $7.9 \times 10^{-6}$ | $8.1 \times 10^{-6}$ | $8.5 \times 10^{-6}$ | $9.5 \times 10^{-6}$ |
| Example 26 | PET 150° C. 1 hr | Film thickness (μm) | 0.47 | 0.45 | 0.46 | 0.50 | 0.45 | 0.47 |
| | | Resistance [Ω·cm] | $6.5 \times 10^{-6}$ | $2.5 \times 10^{-6}$ | $3.1 \times 10^{-6}$ | $3.4 \times 10^{-6}$ | $3.7 \times 10^{-6}$ | $5.2 \times 10^{-6}$ |

| | | | Example 21 | Example 22 | Example 23 | Example 24 | Comparative Example 3 | Comparative Example 4 |
|---|---|---|---|---|---|---|---|---|
| Organic acid metal salt | | | Ag stearate | Cu pentanoate | Au pentanoate | Ag pentanoate | Ag nitrate | Ag hexanoate |
| Dispersant | | | DEAE oleic acid | DEAE oleic acid | DEAE oleic acid | DEAE oleic acid | solsperse 32000 | DEAE oleic acid |
| Reducing agent | | | SUDH | SUDH | SUDH | SUDH | DMAE | hydrazine |
| Example 25 | PET 150° C. 1 hr | Film thickness (μm) | 0.44 | 0.41 | 0.46 | 0.70 | No film obtained | 0.32 |
| | | Resistance [Ω·cm] | $2.0 \times 10^{-5}$ | $9.1 \times 10^{-6}$ | $8.9 \times 10^{-6}$ | $1.1 \times 10^{-5}$ | Unmeasurable | Unmeasurable |
| Example 26 | PET 150° C. 1 hr | Film thickness (μm) | 0.40 | 0.45 | 0.44 | 0.75 | 0.72 | 0.35 |
| | | Resistance [Ω·cm] | $8.3 \times 10^{-6}$ | $4.2 \times 10^{-6}$ | $4.8 \times 10^{-6}$ | $5.6 \times 10^{-6}$ | Unmeasurable | $6.7 \times 10^{-1}$ |

TABLE 3

| | | Example 30 | Example 31 | Example 32 | Comparative Example 6 | Comparative Example 7 |
|---|---|---|---|---|---|---|
| Dispersant | | Solsperse 32000 | solsperse 32000 | pentanoic acid | Solsperse 32000 | solsperse 32000 |
| Discoloration inhibitor | Compound | Octyl mercaptopropionate | SFI-6 | SFI-6 | Octyl mercaptopropionate | — |
| | Additive amount | 5% | 5% | 5% | 5% | — |
| Discoloration resistance test | | ○ | ○ | ○ | Δ | X |
| Volume resistivity (Ω·cm) | | $1.8 \times 10^{-5}$ | $2.3 \times 10^{-5}$ | $9.2 \times 10^{-5}$ | $3.9 \times 10^{-5}$ | $2.6 \times 10^{-5}$ |
| Resistivity stability after discoloration | | ○ | ○ | ○ | Δ | X |

Table 1 shows that it is possible to obtain a volume resistivity in the order of $10^{-5}$ Ω·cm even in a relatively mild drying condition in rotary screen or flexographic printing by use of the conductive inks of the present invention obtained in Examples 8 to 14. In addition, the conductive patterns obtained were superior in adhesiveness to the base material, and the IC tags formed using the patterns had a sufficient communication distance. It is probably because of the improvement in ink fluidity by use of the fine metal particles obtained by the present invention and also favorable arrangement of the silver powder during preparation of the conductive pattern. As a result, a favorable resistance was obtained at low temperature.

On the other hand, the conductive ink obtained in Comparative Example 2, which had a lower silver concentration and contained fine metal particles with wider distribution in particle size, had not sufficient fluidity. As a result, insufficient results in volume resistivity, base material adhesiveness, and IC tag communication tests were obtained.

Table 2 shows that it was possible to obtain a volume resistivity in the order of $10^{-5}$ to $10^{-6}$ Ω·cm even under a mild drying condition at 200° C. or lower and to form a conductive film on a PET base material by use of the fine metal particle dispersion of the present invention obtained in Examples 15 to 23. The conductivity increased as decrease of the number of carbons of the fatty acid present on the surface of the fine metal particle dispersion. This indicates that decrease of the fatty acid decomposition temperature lead to expression of conductivity at low temperature.

The conductive ink obtained in Example 24 was improved in adhesiveness to the base material without sacrifice of conductivity by addition of a binder resin to the fine silver particle dispersion of the present invention.

On the other hand, as the fine metal particle dispersion obtained in Comparative Example 3 contains a high-molecular weight resin as its dispersant, decomposition temperature of resin is high, and thus, caused problems such as non-formation of the coated film or non-expression of conductivity at a drying temperature of 200° C. or lower. Alternatively, the fine metal particle dispersion obtained in Comparative Example 4, which gave many aggregates during preparation and thus had a lower metal concentration in the dispersion, did not have the effect of the melting point decrease in nano-particle, because of increase in particle diameter, and did not give a film having a sufficiently high conductivity.

Table 3 shows that it was possible to reduce discoloration of the coated film and obtain favorable resistivity stability by carrying out the reductive reaction in the presence of a substance having a discoloration-preventing function as in Examples 30 to 32. On the other hand, although it was possible to obtain some discoloration-preventing effect in the dispersion of Comparative Example 7, the resistivity stability thereof resulted in getting worse compared with that of the dispersion reduced in the presence of a discoloration inhibitor. In addition, the dispersion of Comparative Example 7, which contained no substance having discoloration-preventing function, gave a film lower in discoloration resistance and resistivity stability.

What is claimed is:

1. A method for producing a fine metal particle dispersion, wherein a metal compound is reduced in a liquid medium by use of carbodihydrazide represented by the following Formula (1) or a polybasic acid polyhydrazide represented by the following Formula (2):

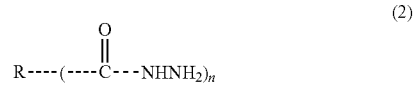

wherein R represents a n-valent polybasic acid residue,
the liquid medium is a mixture of water and a non-aqueous solvent,
the metal compound is added to the mixture of an aqueous solution of carbodihydrazide or the polybasic acid polyhydrazide and a non-polar solvent, and
the metal compound is added as an ammonia complex.

2. The method for producing a fine metal particle dispersion according to claim 1, wherein the polybasic acid polyhydrazide is a dibasic acid dihydrazide.

3. The method for producing a fine metal particle dispersion according to claim 1, wherein the metal compound is reduced using carbodihydrazide represented by the Formula (1) above or the polybasic acid polyhydrazide represented by the Formula (2) after it is dispersed in the liquid medium.

4. The method for producing a fine metal particle dispersion according to claim 1, wherein the metal constituting the metal compound is at least one metal selected from Group VIII and IB metals.

5. The method for producing a fine metal particle dispersion according to claim 1, wherein the aqueous phase is removed after reduction.

6. The method for producing a fine metal particle dispersion according to claim 1, wherein the metal compound is reduced in the presence of a compound with a function of preventing metal discoloration.

7. The method for producing a fine metal particle dispersion according to claim 6, wherein the compound with a function of preventing metal discoloration is a sulfur atom-containing compound.

8. The method for producing a fine metal particle dispersion according to claim 1, wherein the metal compound is dissolved in a solvent prior to adding to the mixture of an aqueous solution of carbodihydrazide or the polybasic acid polyhydrazide and a non-polar solvent.

9. The method for producing a fine metal particle dispersion according to claim 1, wherein metal compound and aqueous ammonia are mixed together to form the ammonia complex.

10. The method for producing a fine metal particle dispersion according to claim 1, wherein the metal compound is reduced in the presence of a pigment dispersant.

* * * * *